US012757430B2

(12) United States Patent
Dewey et al.

(10) Patent No.: US 12,757,430 B2
(45) Date of Patent: Oct. 6, 2026

(54) LOW-RESISTANCE AND THERMALLY STABLE CONTACTS WITH BORIDE, INDIUM, OR GALLIUM METAL COMPOUND LAYERS

(71) Applicant: Intel Corporation, Santa Clara, CA (US)

(72) Inventors: Gilbert Dewey, Beaverton, OR (US); Siddharth Chouksey, Portland, OR (US); Nazila Haratipour, Portland, OR (US); Christopher Jezewski, Portland, OR (US); Jitendra Kumar Jha, Hillsboro, OR (US); Ilya V. Karpov, Portland, OR (US); Matthew V. Metz, Portland, OR (US); Arnab Sen Gupta, Aloha, OR (US); I-Cheng Tung, Hillsboro, OR (US); Nancy Zelick, Portland, OR (US); Chi-Hing Choi, Portland, OR (US); Dan S. Lavric, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 137 days.

(21) Appl. No.: 17/856,982

(22) Filed: Jul. 2, 2022

(65) Prior Publication Data

US 2024/0006533 A1 Jan. 4, 2024

(51) Int. Cl.
*H10D 30/62* (2025.01)
*H10D 62/834* (2025.01)

(52) U.S. Cl.
CPC ........... *H10D 30/62* (2025.01); *H10D 62/834* (2025.01)

(58) Field of Classification Search
CPC .. H10D 30/62; H10D 62/834; H10D 30/6757; H10D 30/014; H10D 30/43;
(Continued)

(56) References Cited

U.S. PATENT DOCUMENTS

| | | | |
|---|---|---|---|
| 6,426,291 | B1 | 7/2002 | Hu et al. |
| 12,310,043 | B2 | 5/2025 | Lo et al. |

(Continued)

OTHER PUBLICATIONS

U.S. Appl. No. 18/390,235, filed Dec. 20, 2023 entitled, CMOS Metal Contacts With Dopant Diffusion Barriers, 91 Pages.

(Continued)

*Primary Examiner* — Monica D Harrison
(74) *Attorney, Agent, or Firm* — Alliance IP, LLC

(57) ABSTRACT

Contacts to p-type source/drain regions comprise a boride, indium, or gallium metal compound layer. The boride, indium, or gallium metal compound layers can aid in forming thermally stable low resistance contacts. A boride, indium, or gallium metal compound layer is positioned between the source/drain region and the contact metal layer. A boride, indium, or gallium metal compound layer can be used in contacts contacting p-type source/drain regions comprising boron, indium, or gallium as the primary dopant, respectively. The boride, indium, or gallium metal compound layers prevent diffusion of boron, indium, or gallium from the source/drain region into the metal contact layer and dopant deactivation in the source/drain region due to annealing and other high-temperature processing steps that occur after contact formation. Boride, indium, or gallium metal contact layers can also reduce the amount of silicide that forms in source/drain regions during processing by limiting contact metal diffusion into source/drain regions.

12 Claims, 16 Drawing Sheets

(58) Field of Classification Search
CPC ........... H10D 30/6735; H10D 30/6219; H10D 62/822; H10D 62/121; H10D 62/151; H10D 64/251; B82Y 10/00
USPC ........................................................ 257/401
See application file for complete search history.

(56) References Cited

U.S. PATENT DOCUMENTS

| | | | |
|---|---|---|---|
| 2008/0296696 A1 | 12/2008 | Yun et al. | |
| 2011/0237058 A1 | 9/2011 | Yun et al. | |
| 2012/0009771 A1 | 1/2012 | Cabral, Jr. et al. | |
| 2015/0333152 A1 | 11/2015 | Lin et al. | |
| 2016/0118305 A1 | 4/2016 | Kleemeier et al. | |
| 2018/0019121 A1 | 1/2018 | Bao et al. | |
| 2020/0006545 A1 | 1/2020 | Liu et al. | |
| 2020/0303373 A1* | 9/2020 | Glass .................. | H10D 84/017 |
| 2021/0066499 A1 | 3/2021 | Holland et al. | |
| 2021/0082707 A1 | 3/2021 | Fan et al. | |
| 2022/0013463 A1 | 1/2022 | Wu et al. | |
| 2023/0420246 A1 | 12/2023 | Karpov et al. | |
| 2024/0006506 A1 | 1/2024 | Dewey et al. | |

OTHER PUBLICATIONS

U.S. Appl. No. 18/390,727, filed Dec. 20, 2023 entitled, Incorporation of Semiconductor Doping Materials in Metal Contacts via Reactive Sputtering, 79 Pages.
USPTO Non-Final Office Action in U.S. Appl. No. 17/847,625 mailed on Aug. 6, 2025 (25 pages).
USPTO Non-Final Office Action in U.S. Appl. No. 17/856,979 mailed on Jul. 24, 2025 (10 pages).
USPTO Notice of Allowance in U.S. Appl. No. 17/856,979 mailed on Jan. 23, 2026 (4 pages).

* cited by examiner

LOW-RESISTANCE AND THERMALLY STABLE CONTACTS WITH BORIDE, INDIUM, OR GALLIUM METAL COMPOUND LAYERS

BACKGROUND

Metal contacts can be used to provide electrically conductive connections to semiconductor source/drain regions of field-effect transistors. Metal contacts have an associated parasitic resistance that, if large enough, can affect transistor performance.

DETAILED DESCRIPTION

Figure 1A:
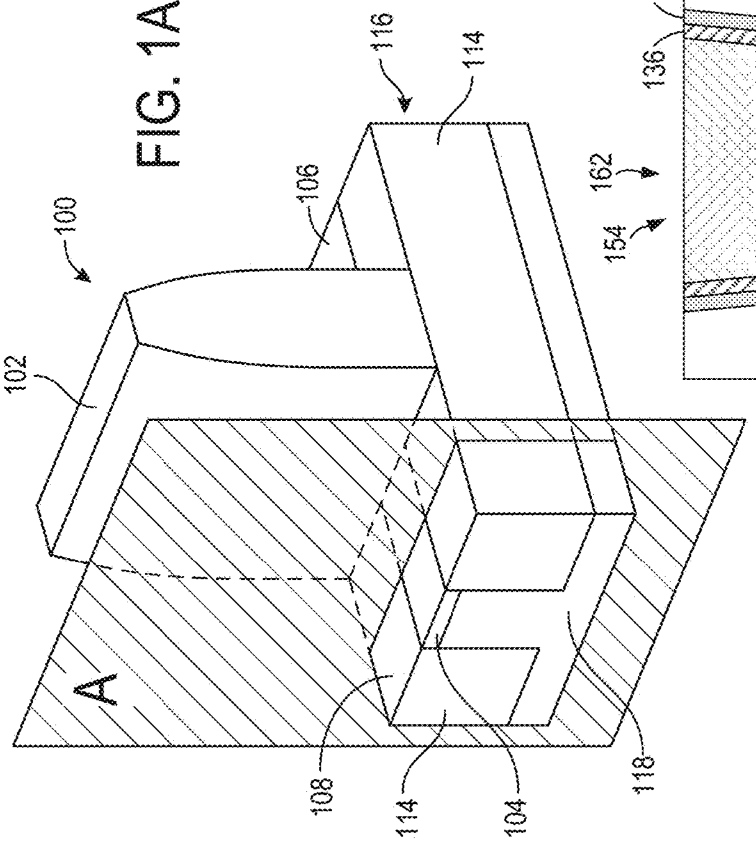
FIGS. 1A-1B illustrate simplified perspective views of an exemplary planar field-effect transistor (FET) comprising source/drain contacts with a boride, indium, or gallium metal compound layer.

Metal contacts to MOSFET (metal-oxide-silicon field-effect transistor) source/drain regions can be thermally unstable in that their resistance (contact resistance) increases after being subjected to high-temperature processing steps that occur in a semiconductor device manufacturing process after source/drain region formation. These back-end of line (BEOL) process steps can involve numerous annealing and other high-temperature processing steps that can cause diffusion of p-type dopants (e.g., boron, indium, and gallium) from the source/drain region into the contact and the deactivation of dopants (the movement of dopants off of a crystal lattice substitutional site of the semiconductor) in the source/drain region. Silicide formation at the contact-source/drain region interface can also catalyze the outdiffusion and deactivation of dopants in source/drain regions. Dopant outdiffusion and deactivation are understood to be at least partially responsible for metal contact thermal instability. The increased resistance of source/drain contacts due to their thermal instability can impact transistor performance in the form of, for example, reduced drive current.

Described herein are metal contacts comprising a boride, indium, or gallium metal compound layer for use in contacting p-type source/drain regions of transistors. The boride, indium, or gallium metal compound layers can aid in forming low-resistance contacts that are thermally stable. A boride, indium, or gallium metal compound layer is positioned between the p-type source/drain region and the contact metal layer of a contact. A metal compound layer comprising boron, indium, or gallium can be used in a contact to a p-type source/drain region comprising one or more of any type of p-type dopants. For example, in some embodiments, a boride metal compound layer can be used in contacts that contact p-type source/drain regions in which boron, indium, or gallium is the primary p-type dopant; an indium metal compound layer can be used in contacts contacting to p-type source/drain regions in which indium, boron, or gallium is the primary p-type dopant; and a gallium metal compound layer can be used in contacts contacting to p-type source/drain regions in which gallium, boron, or indium is the primary p-type dopant The boride, indium, or gallium metal compound layer can aid in forming thermally stable low-resistance contacts by acting as a diffusion barrier and presenting a dopant concentration gradient that prevents or reduces dopant diffusion out of the source/drain regions and into the boride, indium, or gallium metal compound layer. In some embodiments, boride, indium, and gallium metal compound layers have an atomic ratio of about 50% boron, indium, and gallium, respectively, and boride, indium, or gallium metal compound layers can have boron, indium, and gallium concentrations on the order of $10^{23}$ $cm^{-3}$. In other embodiments, the metal compound layer can have an atomic ratio of 5-80% of boron, indium, or gallium. In such embodiments, the metal compound layers can have boron, indium, or gallium concentrations on the order of $10^{22}$ $cm^{-3}$ or greater. The concentration of boron, indium, or gallium in the metal compound layer is thus greater than the concentration of boron, indium, and gallium in heavily doped source/drain regions, which can be on the order of $10^{21}$ $cm^{-3}$. Thus, the inclusion of a boride, indium, or gallium metal compound layer may result in a "pile-up" of p-type dopants at the contact-source/drain region interface due to the diffusion of boron, indium, or gallium from the metal compound layer to the source/drain region as the result of BEOL high-temperature processing steps. That is, the concentration of boron, indium, or gallium in the source/drain region at the source/drain region-contact interface can be greater than that in the source/drain region after source/drain formation and prior to contact formation. Thus, an even greater concentration of boron, indium, or gallium may be activated in the source/drain region at the source/drain region-contact interface, which may result in a contact resistance less than that of contacts without a boride, indium, or gallium metal compound layer. Moreover, boride, indium, and gallium metal compound layers can also reduce the amount of contact metal silicide that forms in source/drain regions by limiting the amount of contact metal that diffuses from the contact metal layer into source/drain regions, which can further serve to reduce contact resistance. Dopant pile-up and the formation of thinner silicide regions at the source/drain region-contact interface can further aid in the formation of thermally stable low-resistance contacts. The metal contact technologies disclosed herein can be used in planar FETs, tri-gate transistors (FinFETs), gate-all-around field-effect transistors (GAAFETs), and other transistor architectures.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact with each other and "coupled" may indicate elements cooperate or interact with each other, but they may or may not be in direct physical or electrical contact. Furthermore, the terms "comprising," "including," "having," and the like, as used with respect to embodiments of the present disclosure, are synonymous.

Terms modified by the word "substantially" include arrangements, orientations, spacings, or positions that vary slightly from the meaning of the unmodified term. For example, a sidewall of a contact layer that is substantially perpendicular to a bottom portion of a contact layer or a substrate surface includes sidewalls that are within 20 degrees of perpendicular to the bottom portion of the contact layer or substrate surface, and a first surface that is substantially parallel to a second surface can include a first surface that is within several degrees of parallel from the second surface. Values modified by the word "about" include values with +/−10% of the listed values and values listed as being within a range include those within a range from 10% less than the listed lower range limit and 10% greater than the listed higher range limit.

Reference is now made to the drawings, which are not necessarily drawn to scale, wherein similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims.

As used herein, the phrase "located on" in the context of a first layer, region, or component located on a second layer, region, or component refers to the first layer, region, or component being directly physically attached to the second part or component (no layers or components between the first and second layers or components) or physically attached to the second layer, region, or component with one or more intervening layers or components. For example, with reference to FIGS. 1C-1D, the fill metal layer 140 is located on the source region 104 (with intervening layers 128 and 136).

As used herein, the term "positioned adjacent" refers to layers or components that are in physical contact with each other. That is, there is no layer, region, or component between the layers or components stated as being positioned adjacent to each other. For example, a layer X that is positioned adjacent to a layer Y refers to a layer that is in physical contact with layer Y.

As used herein, the term "integrated circuit component" refers to a packaged or unpackaged integrated circuit product. A packaged integrated circuit component comprises one or more integrated circuit dies mounted on a package substrate with the integrated circuit dies and package substrate encapsulated in a casing material, such as a metal, plastic, glass, or ceramic. In one example, a packaged integrated circuit component contains one or more processor units mounted on a substrate with an exterior surface of the substrate comprising a solder ball grid array (BGA). In one example of an unpackaged integrated circuit component, a single monolithic integrated circuit die comprises solder bumps attached to contacts on the die. The solder bumps allow the die to be directly attached to a printed circuit board. An integrated circuit component can comprise one or more of any computing system component described or referenced herein or any other computing system component, such as a processor unit (e.g., system-on-a-chip (SoC), processor core, graphics processor unit (GPU), accelerator, chipset processor), I/O controller, memory, or network interface controller.

Figure 1B:
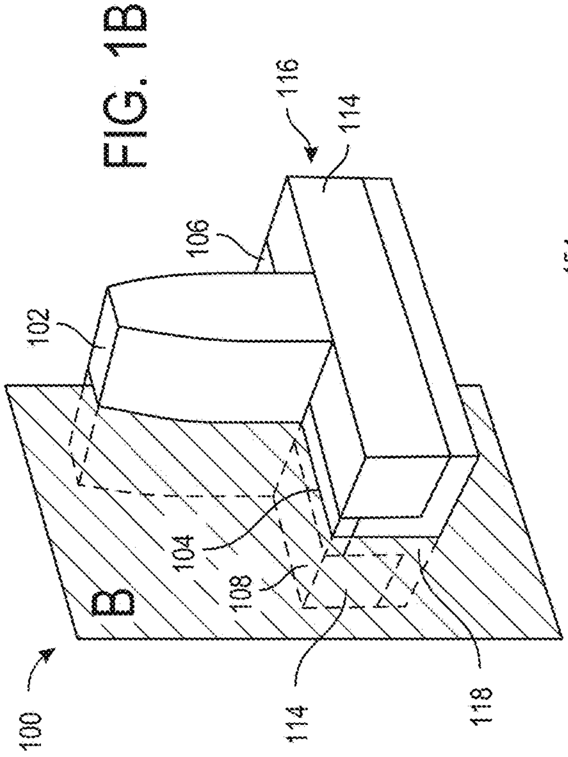

FIGS. 1A-1B illustrate simplified perspective views of an exemplary planar field-effect transistor (FET) comprising source/drain contacts with a boride, indium, or gallium metal compound layer. Transistor 100 is formed on a substrate 116 and comprises a gate 102, a source region 104, and a drain region 106. The substrate 116 comprises a surface 108, a bulk region 118, and isolation regions 114 that separate the source and drain regions 104 and 106 from other transistors. The transistor 100 is planar in that the source region 104 and the drain region 106 are planar with respect to the surface 108 of the substrate 116.

Figure 1C:
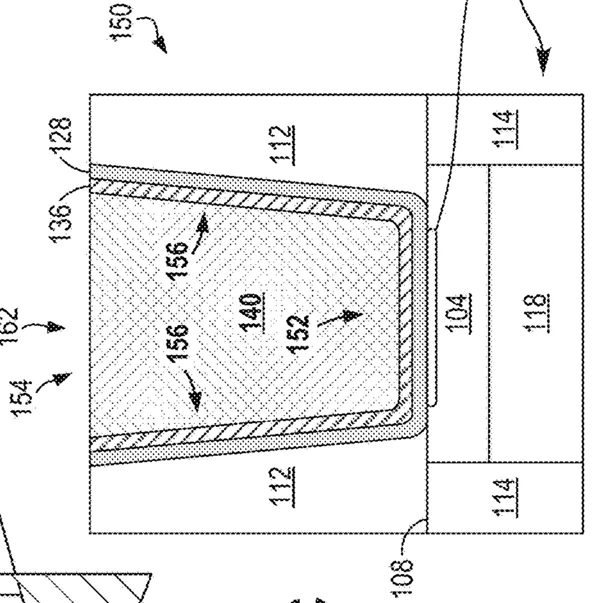
FIG. 1C is a cross-sectional view of the exemplary planar FET of FIGS. 1A-1B taken along plane A of FIG. 1A.
Figure 1D:
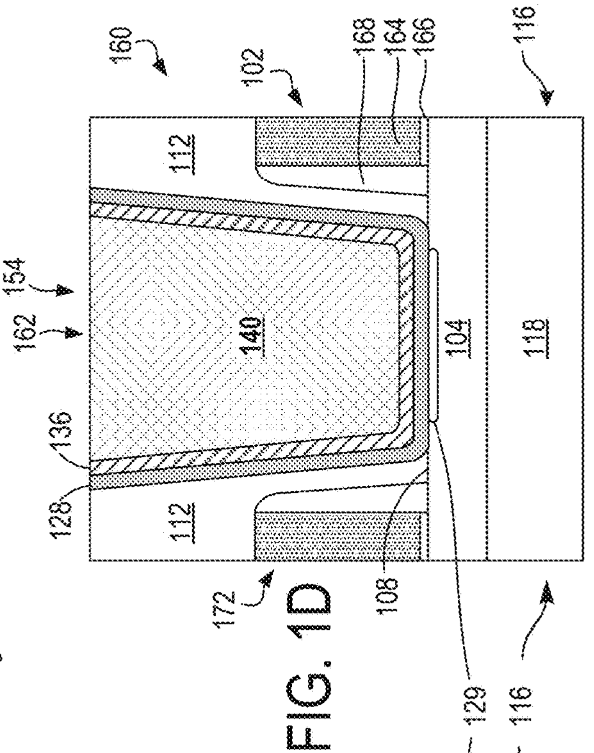
FIG. 1D is a cross-sectional view of the exemplary planar FET of FIGS. 1A-1B taken along plane B of FIG. 1B.

FIG. 1C is a cross-sectional view of the exemplary planar FET of FIGS. 1A-1B taken along plane A of FIG. 1A. Plane A cuts across the source region 104 of transistor 100. FIG. 1D is a cross-sectional view of the exemplary planar FET of FIGS. 1A-1B taken along plane B of FIG. 1B. Plane B extends along the source region 104 of transistor 100. Cross-sectional views 150 and 160 illustrate a contact 154 contacting the source region 104. FIG. 1D illustrates the contact 154 positioned between gate 102 and a second gate 172 belonging to a second transistor (not shown in FIGS. 1A-1B). The contact 154 is positioned adjacent to dielectric layer portions 112 and comprises a boride, indium, or gallium metal compound layer 128, a contact metal layer 136, and a fill (trench, plug) metal layer 140. The dielectric layer 112 isolates the contact 154 from adjacent contacts and/or other features. A portion 152 of the boride, indium, or gallium metal compound layer 128 is positioned adjacent to the source region 104 and portions 156 of the boride, indium, or gallium metal compound layer 128 are not positioned adjacent to the source region 104. The portion 152 of the layer 128 can be referred to as a bottom portion of the layer 128 and the portions 156 can be referred to as sidewall portions of the layer 128. In some embodiments, the sidewall portions 156 are substantially perpendicular to the bottom portion 152. The sidewall portions of a boride, indium, or gallium metal compound layer of any contact described herein can be positioned adjacent to a dielectric layer (such as dielectric layer 112 as illustrated in FIGS. 1C-1D) or other structures (e.g., gate spacers).

The contact metal layer 136 is positioned adjacent to the boride, indium, or gallium metal compound layer 128. The boride, indium, or gallium metal compound layer 128 and the contact metal layer 136 form a contact hole (or cavity) 162 in the dielectric layer 112 and the fill metal layer 140 at least partially fills the hole 162. In some embodiments, the contact 154 further comprises a barrier layer positioned between the contact metal layer 136 and the fill metal layer 140.

The gate 102 comprises a gate electrode 164, a gate dielectric layer 166, and a gate spacer 168. The gate spacer 168 isolates the gate stack (e.g., gate electrode 164, gate dielectric layer 166) from adjacent features.

In some embodiments, a silicide layer 129 is located in a portion of the source region 104 positioned adjacent to the boride, indium, or gallium metal compound layer 128 after processing is complete. The silicide layer 129 can be formed due to the diffusion of metal from the contact metal layer 136 to the source region 104. As the presence of the boride, indium, or gallium metal compound layer 128 can limit the amount of metal diffusion from the contact metal layer 136 to the source region 104, the thickness of the silicide layer 129 can be less than in embodiments where a contact does not have a boride, indium, or gallium metal compound layer. The thickness of the silicide layer 129 can be less than 3 nm in embodiments where a contact comprises a boride, indium, or gallium metal compound layer. In some embodiments where a contact comprises a boride, indium, or gallium metal compound layer, the thickness of the silicide layer 129 can be less than 1 nm. In some embodiments, the boride, indium, or gallium metal compound layer may be an effective enough barrier to prevent contact metal from diffusing into the source/drain region that no silicide layer comprising the contact metal is formed at the surface of the source/drain region.

Figure 2B:
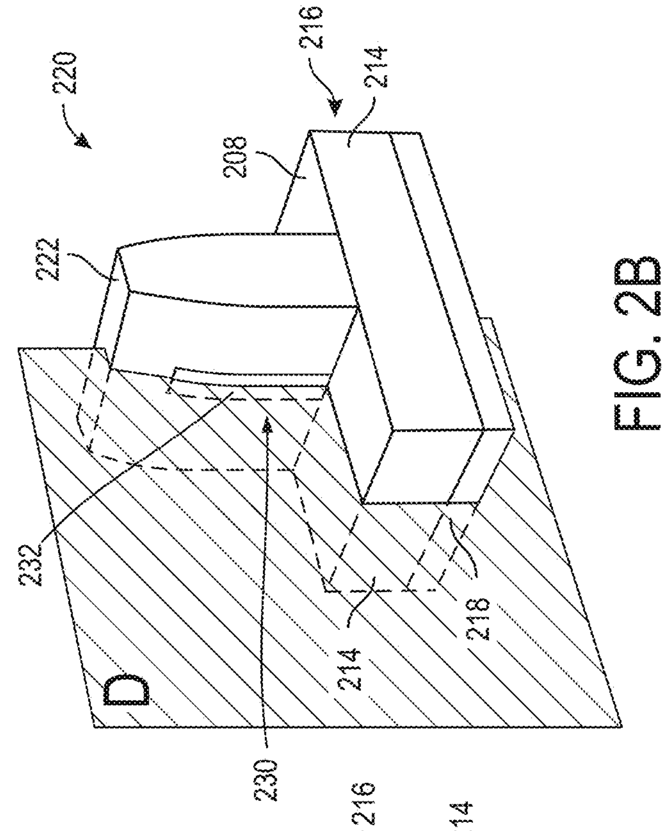
FIGS. 2A-2B illustrate simplified perspective views of a first exemplary FinFET comprising source/drain contacts with a boride, indium, or gallium metal compound layer.
Figure 2A:
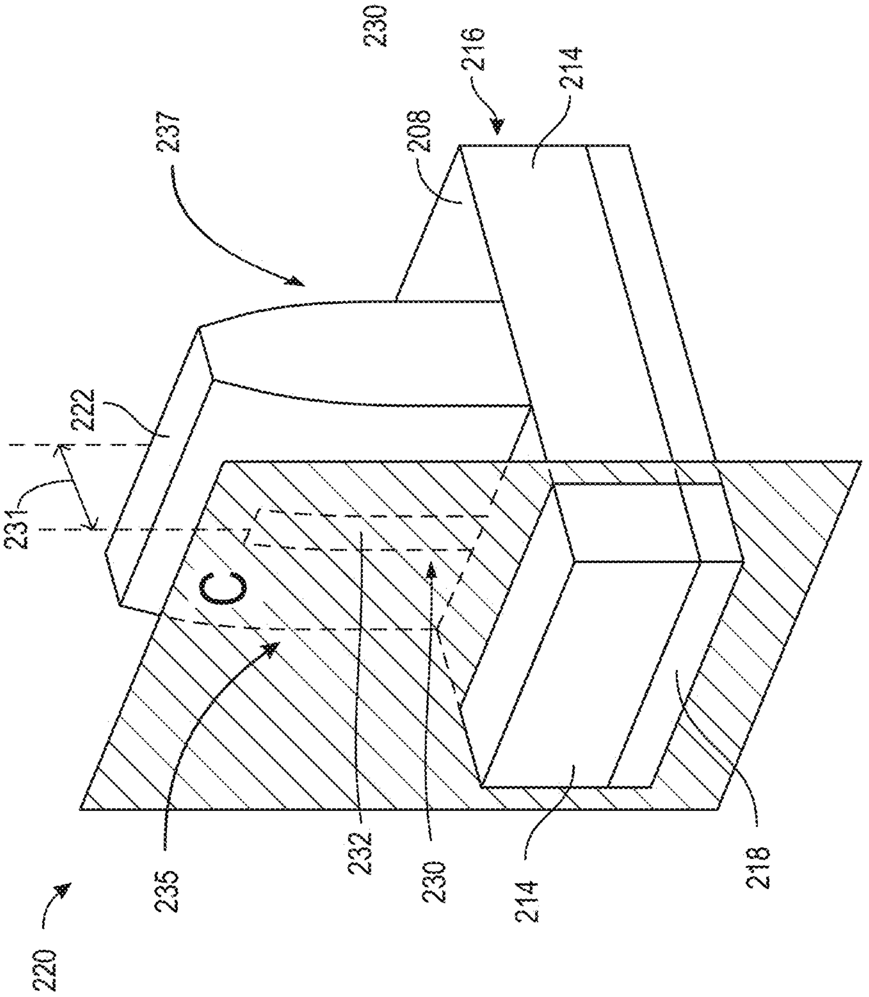
Figure 2C:
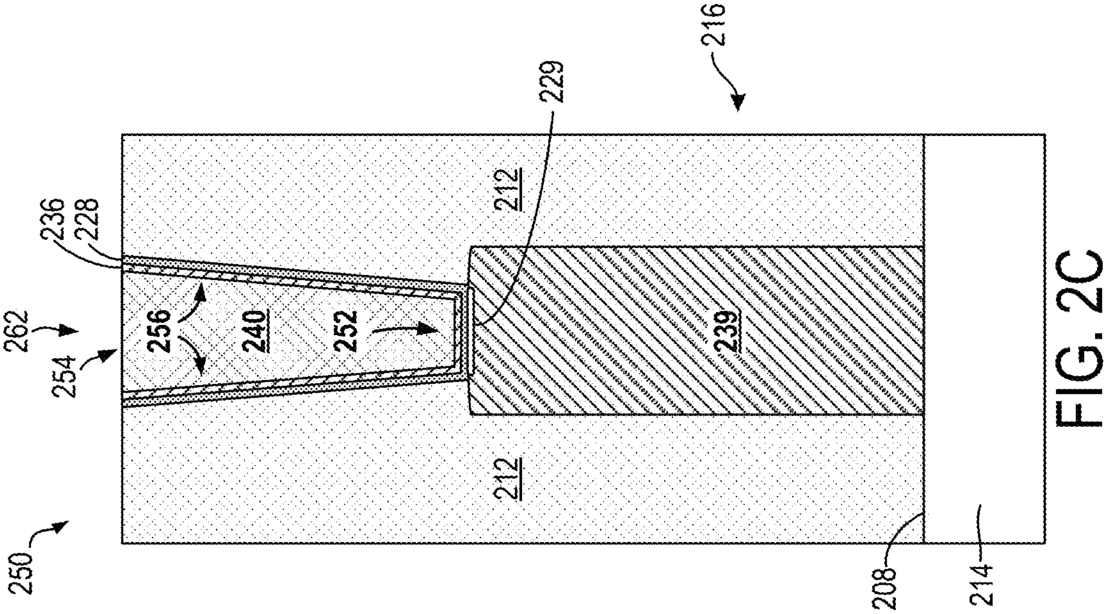
FIG. 2C is a cross-sectional view of the FinFET of FIGS. 2A-2B taken along plane C of FIG. 2A.
Figure 2D:
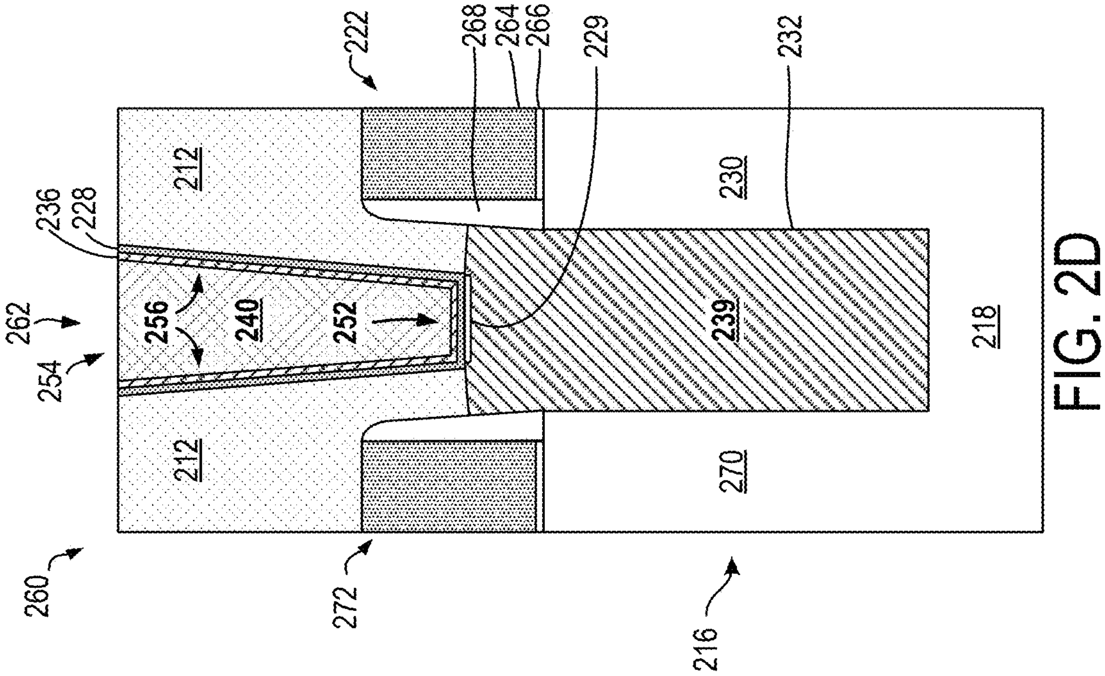
FIG. 2D is a cross-sectional view of the FinFET of FIGS. 2A-2B taken along plane D of FIG. 2B.

FIGS. 2A-2B illustrate simplified perspective views of a first exemplary FinFET comprising source/drain contacts with a boride, indium, or gallium metal compound layer. FinFET 220 comprises a gate 222, a source region 235, a drain region 237, and a fin 230. The transistor 220 is formed on a substrate 216 comprising a surface 208, a bulk region 218, and isolation regions 214. FIG. 2C is a cross-sectional view of the FinFET 220 taken along plane C of FIG. 2A. Plane C cuts across the source region 235 of transistor 220. FIG. 2D is a cross-sectional view of the FinFET 220 taken along plane D of FIG. 2B. Plane D extends along the source region 235 of transistor 220 in a direction perpendicular to that of plane C (e.g., along the direction of the channel of the FinFET 220 from the source region 235 to the drain region 237).

The source region 235 comprises a source semiconductor region (or layer) 239 (shown in FIGS. 2C-2D but not FIGS. 2A-2B) positioned adjacent to end 232 of the fin 230 and the surface 208 of the substrate 216. The drain region 237 comprises a drain semiconductor region (or layer) positioned adjacent to the ends of the source semiconductor region 239 that is opposite the end 232. The drain semiconductor region is further positioned adjacent to the surface 208 of the substrate 216.

The gate 222 controls the flow of current from the source region 235 to the drain region 237. The channel region of the transistor 220 is formed by the gate 222 encompassing the fin 230. The gate 222 comprises a gate electrode 264, a gate dielectric layer 266, and a gate spacer 268. The gate spacer 268 isolates the gate stack (e.g., gate electrode 264, gate dielectric layer 266) from adjacent features.

The fin 230 extends upwards from the surface 208 of the substrate 216 and extends along a length 231 of the surface 208 from an end 232 of the fin 230 to an opposite end (not shown) of the fin 230. In the FinFET embodiment illustrated in FIGS. 2A-2B, the fin 230 does not extend into the source and drain regions 235 and 237. That is, the source semiconductor region 239 and the drain semiconductor region are separate semiconductor regions from the fin 230. In some embodiments, the source and drain semiconductor regions are epitaxially grown on the surface 208 of the substrate 216. The source semiconductor region 239 is illustrated in FIG. 2D as being located between gate 222 and fin 230 of the transistor 220 and a second gate 272 and a second fin 270 of a second FinFET. The second gate 272 and the second fin 270 are not illustrated in FIGS. 2A-2B, for-ease of illustration.

Cross-sectional views 250 and 260 illustrate a contact 254 contacting the source semiconductor region 239. The contact 254 is not shown in FIGS. 2A-2B for ease of illustration. The contact 254 is positioned adjacent to dielectric layer portions 212 and has a similar structure to the contact 154 of FIGS. 1C-1D. The contact 254 comprises a boride, indium, or gallium metal compound layer 228, a contact metal layer 236, and a fill metal layer 240. The dielectric layer portions 212 isolate the contact 254 from adjacent contacts and/or other features. A portion (bottom portion) 252 of the boride, indium, or gallium metal compound layer 228 is positioned adjacent to the source semiconductor region 239 and portions 256 (sidewall portions) of boride, indium, or gallium metal compound layer 228 are not positioned adjacent to the source semiconductor region 239. In some embodiments, the sidewall portions 256 are substantially perpendicular to the bottom portion 252.

The contact metal layer 236 is positioned adjacent to the boride, indium, or gallium metal compound layer 228. The boride, indium, or gallium metal compound layer 228 and the contact metal layer 236 form a contact hole (or cavity) 262 in the dielectric layer 212 and the fill metal layer 240 at least partially fills the hole 262. In some embodiments, the contact 254 further comprises a barrier layer positioned between the contact metal layer 236 and the fill metal layer 240.

In some embodiments, a silicide layer 229 is located in a portion of the source region 235 positioned adjacent to the boride, indium, or gallium metal compound layer 228 after processing is complete. The silicide layer 229 can be formed in the same manner as silicide layer 129, as described above, and have a similar thickness as the silicide layer 129 (less than 3 nm in some embodiments and less than 1 nm in other embodiments).

Figure 3A:
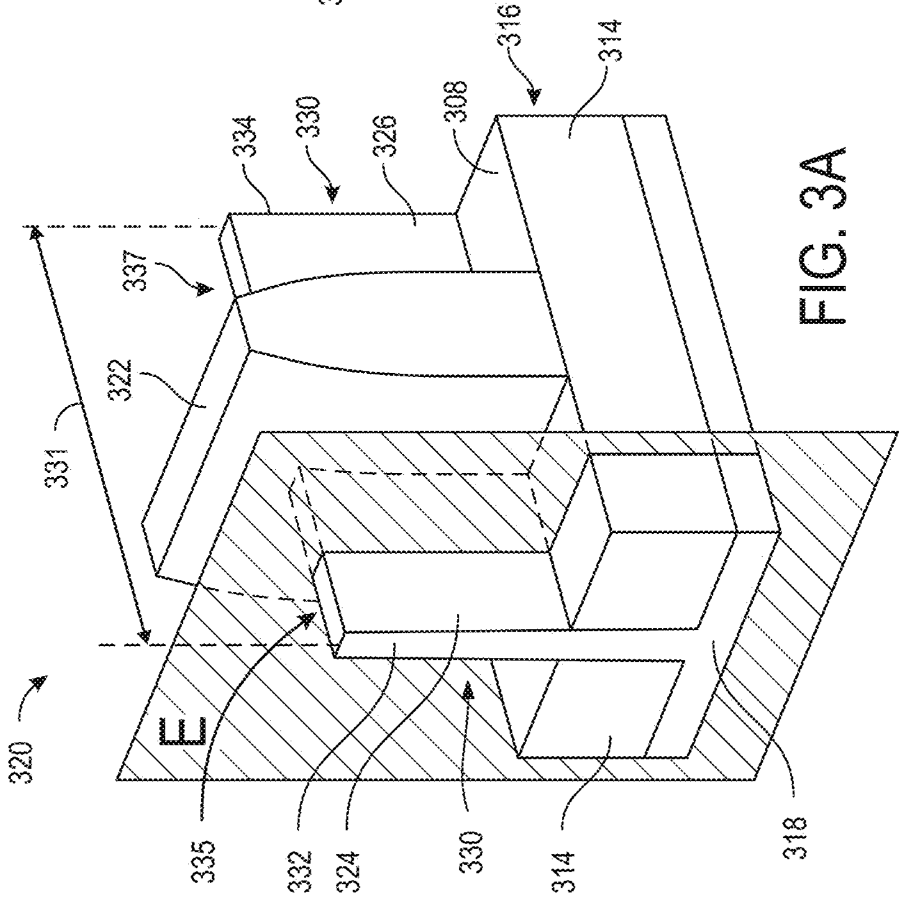
FIGS. 3A-3B illustrate simplified perspective views of a second exemplary FinFET comprising source/drain contacts with a boride, indium, or gallium metal compound layer.
Figure 3B:
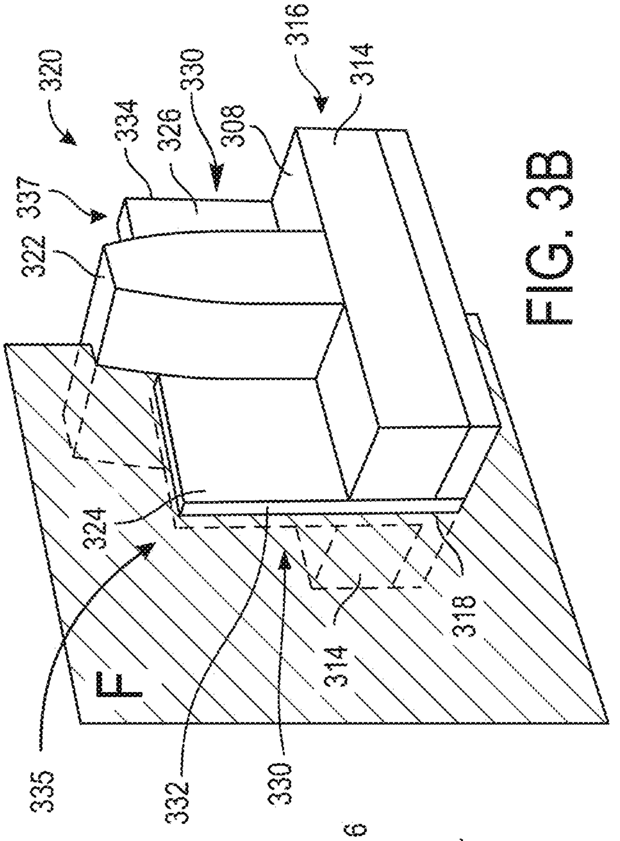
Figures 3C, 3D, 3E:
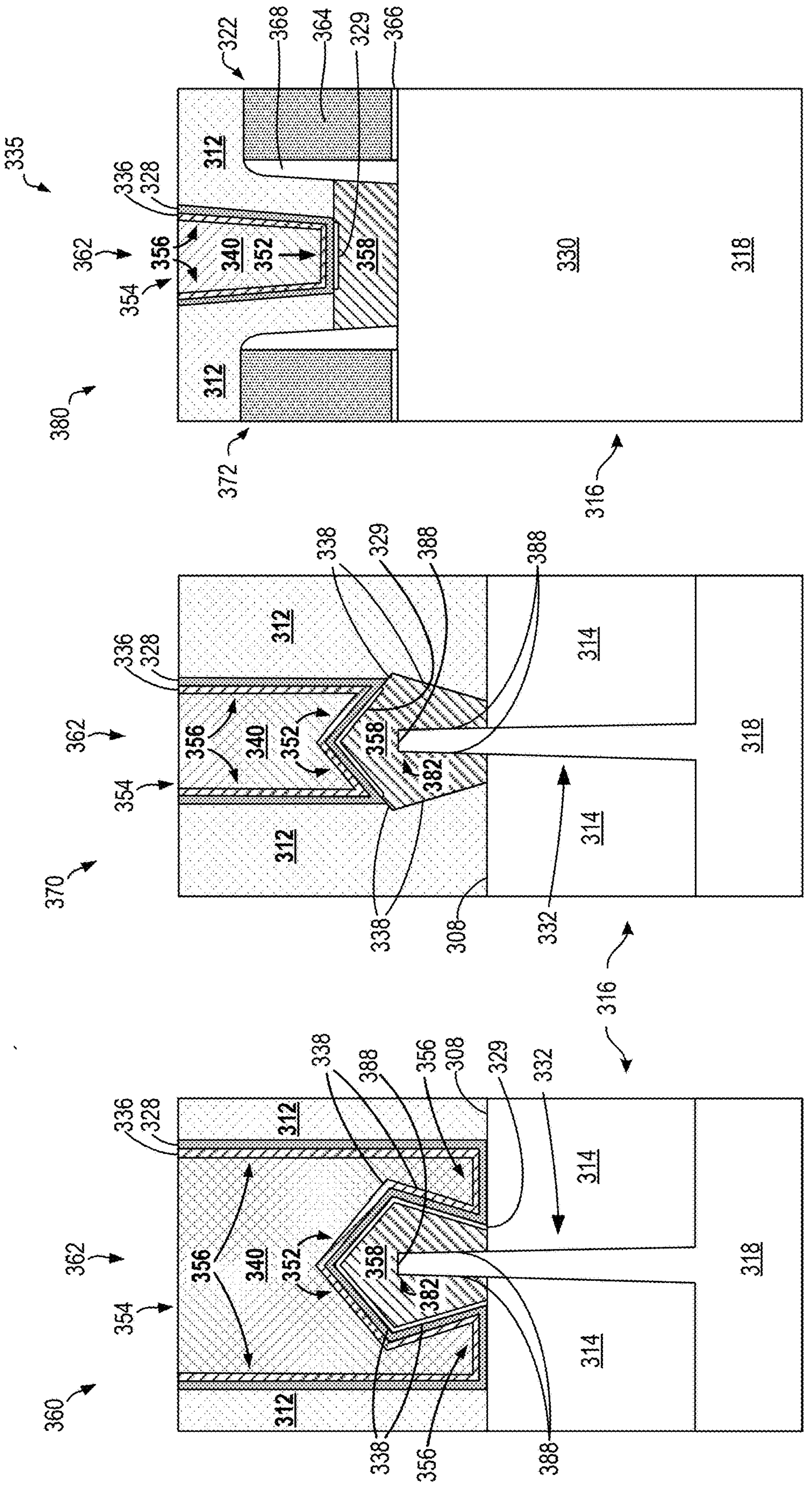
FIGS. 3C-3D are cross-sectional views of the FinFET of FIGS. 3A-3B taken along plane E of FIG. 3A.
FIG. 3E is a cross-sectional view of the FinFET of FIGS. 3A-3B taken along plane F of FIG. 3B.

FIGS. 3A-3B illustrate simplified perspective views of a second exemplary FinFET comprising source/drain contacts with a boride, indium, or gallium metal compound layer. FinFET 320 comprises a gate 322, a source region 335, a drain region 337, and a fin 330. The transistor 320 is formed on a substrate 316 comprising a surface 308, a bulk region 318, and isolation regions 314. FIGS. 3C-3D are cross-sectional views of the FinFET 320 taken along plane E of FIG. 3A. Plane E cuts across the source region 335 of FinFET 320. FIG. 3E is a cross-sectional view of the FinFET 320 taken along plane F of FIG. 3B. Plane F extends along the source region 335 of transistor 320 in a direction perpendicular to that of plane E (e.g., along the direction of the channel region of the FinFET 320 from the source region 335 to the drain region 337).

The gate 322 controls the flow of current from a source portion 324 of the fin 330 to a drain portion 326 of the fin 330. The channel region of the transistor 320 is formed by the gate 322 encompassing a portion of the fin 330. The gate 322 comprises a gate electrode 364, a gate dielectric layer 366, and a gate spacer 368. The gate spacer 368 isolates the gate stack (e.g., gate electrode 364, gate dielectric layer 366) from adjacent features.

The fin 330 extends upwards from the surface 308 of the substrate 316 and extends along a length 331 of the surface 308 from a first end 332 to a second end 334. The source portion 324 of the fin 330 extends into the source region 335 and the drain portion 326 extends into the drain region 337. The source region 335 is shown in FIG. 3E as being located between gate 322 and a second gate 372 of a second FinFET. The second gate 372 is not illustrated in FIGS. 3A-3B for ease of illustration. FIG. 3E illustrates that fins of one FinFET can be used in adjacent FinFETs (e.g., fin 330 is used in transistor 320 and the adjacent transistor comprising the second gate 372).

Cross-sectional views 360 and 370 illustrate a semiconductor region 358 positioned adjacent to the portion of the fin 330 extending past the surface 308 of the substrate 316. The semiconductor region 358 can aid in the formation of low resistance source/drain contacts by, for example, providing more source/drain surface area upon which a metal contact can be formed. The semiconductor region 358 is illustrated as encompassing the portion of the fin 330 extending past the surface 308. That is, the semiconductor region 358 encompasses outer surfaces 388 of the fin 330, the outer surface 388 comprising the surfaces of the sidewalls of the fin 330 extending past the surface 308 and a surface of an end 382 of the fin 330. In other embodiments, the semiconductor region 358 encompasses less than all of the outer surface 388 of the fin 330. In still other embodiments, the semiconductor region 358 encompasses at least the end 382 of the fin 330. Further, the semiconductor region 358 can extend in a direction along the length 331 of the fin 330 the entire length of the source portion 324 of the fin 330 (as illustrated in FIG. 3E) or along a portion of the entire length of the source portion 324 of fin 330.

The semiconductor region 358 can be grown epitaxially with in situ doping of one or more p-type dopants (e.g., boron, indium, gallium). As used herein, the term "fin" can refer to either a fin with or without a semiconductor region positioned adjacent to the fin (e.g., 358). For example, the term "fin" can refer to either fin 330 or the combined structure of fin 330 plus the semiconductor region 358. In some embodiments, a contact is formed on a fin with no semiconductor region positioned between the contact and the fin. For example, in some embodiments, with reference to FIGS. 3C-3E, boride, indium, or gallium metal compound layer 328 can be positioned adjacent to the fin 330.

Cross-sectional views 360, 370, and 380 illustrate a contact 354 contacting the semiconductor region 358. The contact 354 is not shown in FIGS. 3A-3B for ease of illustration. The contact 354 is formed in dielectric layer portions 312 and has a similar structure to the contact 154 of FIGS. 1C-1D. The contact 354 comprises a boride, indium, or gallium metal compound layer 328, a contact metal layer 336, and a fill metal layer 340. The dielectric layer 312 isolates the contact 354 from adjacent contact and/or other features.

The contact metal layer 336 is positioned adjacent to the boride, indium, or gallium metal compound layer 328. The boride, indium, or gallium metal compound layer 328 and the contact metal layer 336 form a contact hole (or cavity) 362 in the dielectric layer 312 and the fill metal layer 340 at least partially fills the hole 362. In some embodiments, the contact 354 further comprises a barrier layer positioned between the contact metal layer 336 and the fill metal layer 340.

A portion 352 of the boride, indium, or gallium metal compound layer 328 is positioned adjacent to the semiconductor region 358 and portions 356 of the boride, indium, or gallium metal compound layer 328 are not positioned adjacent to the semiconductor region 358. The portions 356 of the boride, indium, or gallium metal compound layer 328 can be positioned adjacent to a dielectric layer (such as dielectric layer 312 as illustrated in FIGS. 3C-3D) or other structures (e.g., gate spacers 368).

FIG. 3C illustrates an embodiment in which the contact 354 encompasses the outer surface 338 of the semiconductor region 358 (that is, the outer surface of the semiconductor region 358 not positioned adjacent to the surface 308 of the substrate 316). In such embodiments, the contact 354 in FIG. 3C can be referred to as a wrap-around contact. FIG. 3D illustrates an embodiment in which the contact 354 encompasses less than all of the outer surface 338 of the semiconductor region 358.

In some embodiments, a silicide layer 329 is located in a portion of the semiconductor region 358 (or the fin 330 if there is no semiconductor region 358) positioned adjacent to the boride, indium, or gallium metal compound layer 328. The silicide layer 329 can be formed in the same manner as silicide layer 129, as described above, and have a similar thickness as the silicide layer 129 (less than 3 nm in some embodiments, and less than 1 nm in other embodiments).

The FinFETs 220 and 320 are non-planar in that the fins (230, 330) extend upwards from the surface (208, 308) of the substrate (216, 316). As the gates (222, 322) of the FinFETs 220 and 320 encompass three sides of a fin, the FinFETs can be considered tri-gate transistors. FIGS. 2A-2D and 3A-3E illustrate a gate comprising one fin, but the gate of a FinFET can comprise multiple fins in other embodiments.

Figure 4B:
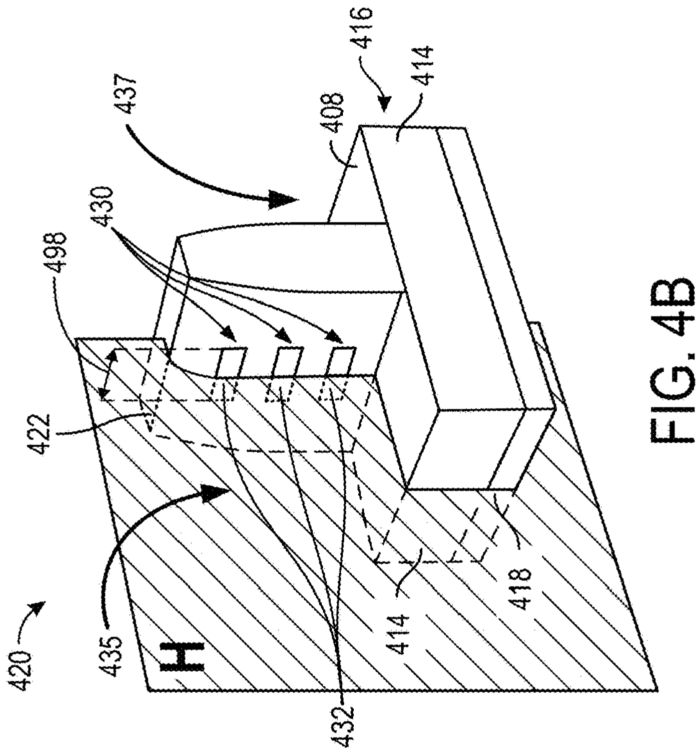
FIGS. 4A-4B illustrate simplified perspective views of a first exemplary GAAFET comprising source/drain contacts with a boride, indium, or gallium metal compound layer.
Figure 4A:
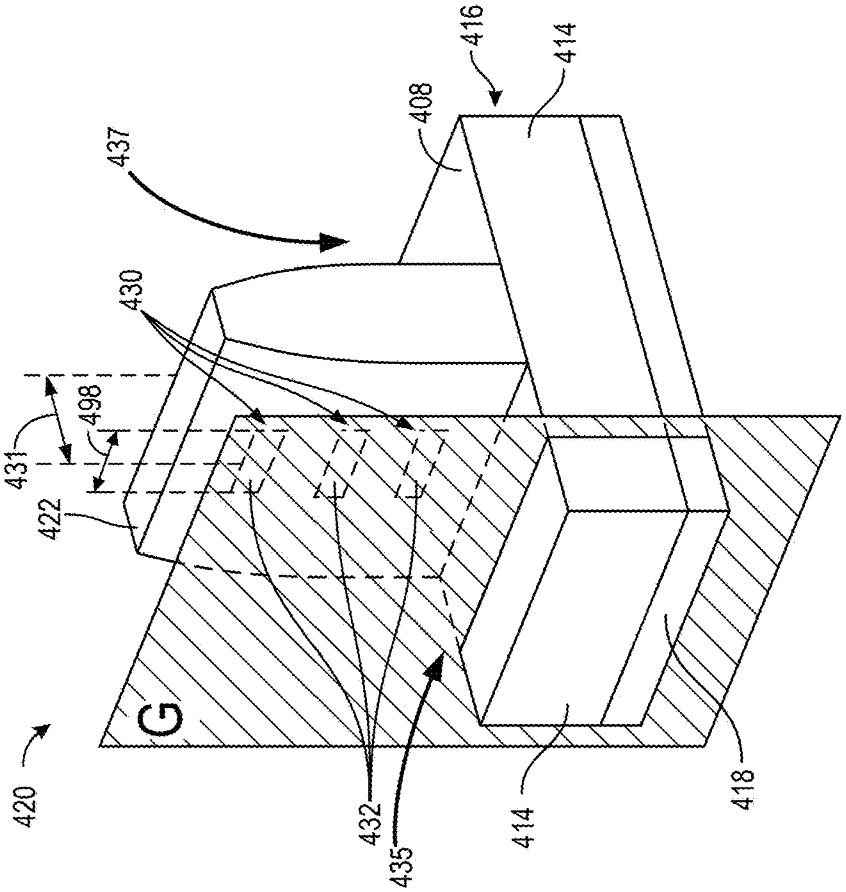
Figure 4D:
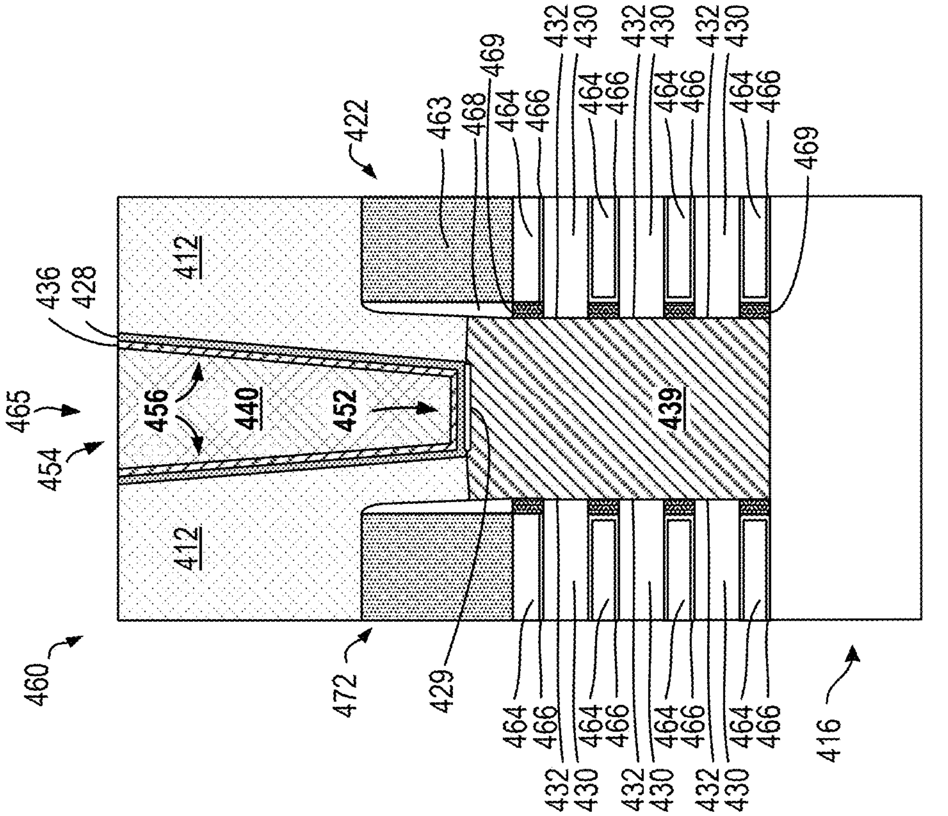
FIG. 4D is a cross-sectional view of the GAAFET of FIGS. 4A-4B taken along plane H of FIG. 4B.
Figure 4C:
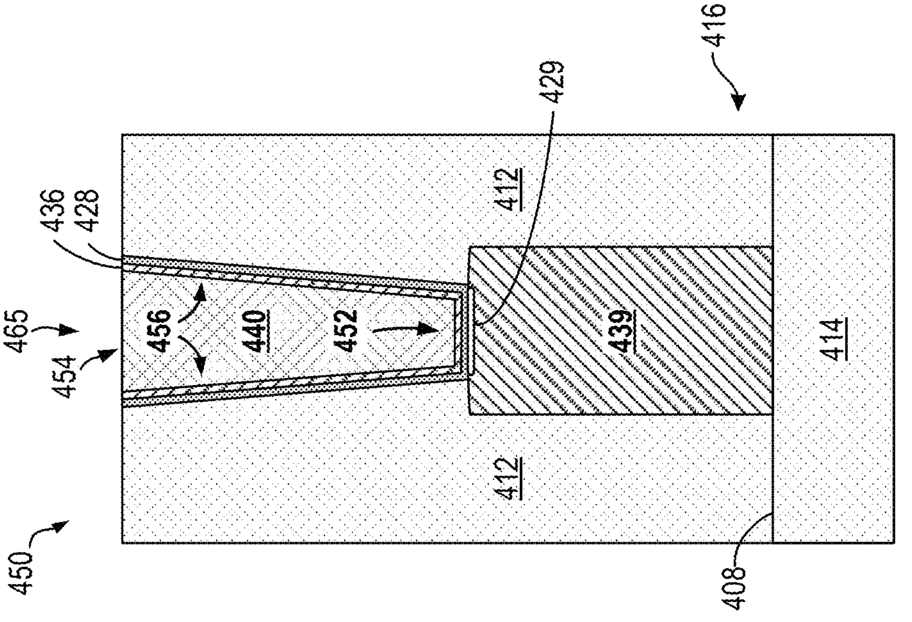
FIG. 4C is a cross-sectional view of the GAAFET of FIGS. 4A-4B taken along plane G of FIG. 4A.

FIGS. 4A-4B illustrate simplified perspective views of a first exemplary GAAFET comprising source/drain contacts with a boride, indium, or gallium metal compound layer. GAAFET 420 comprises a gate 422, a source region 435, a drain region 437, and semiconductor layers 430. The semiconductor layers 430 extend through the gate 422 from the source region 435 to the drain region 437 and extend along a length 431 from a first end 432 of the individual semiconductor layer 430 to an opposite end (not shown) of the individual semiconductor layer 430. The transistor 420 is formed on a substrate 416 comprising a surface 408, a bulk region 418, and isolation regions 414. FIG. 4C is a cross-sectional view of the GAAFET 420 taken along plane G of FIG. 4A. Plane G cuts across the source region 435 of transistor 420. FIG. 4D is a cross-sectional view of the GAAFET 420 taken along plane H of FIG. 4B. Plane H extends along the source region 435 of transistor 420 in a direction perpendicular to that of plane G (e.g., along the direction of the channel region of the GAAFET 420 from the source region 435 to a drain region 437). The gate 422 controls the flow of current from the source region 435 to the drain region 437. The channel region of the transistor 420 is formed by the gate 422 encompassing the semiconductor layers 430. The semiconductor layers 430 are located above and separate from the substrate 416 and are substantially parallel to the surface 408 of the substrate 416.

The source region 435 comprises a source semiconductor region (or layer) 439 (shown in FIGS. 4C-4D, but not FIGS. 4A-4B) positioned adjacent to ends 432 of the semiconductor layers 430 and the surface 408 of the substrate 416. FIG. 4D illustrates the source semiconductor region 439 positioned between gate 422 and a gate 472 of a second GAAFET (not shown in FIGS. 4A-4B, for ease of illustration). The drain region 437 comprises a drain semiconductor region (not shown in FIGS. 4A-4D) positioned adjacent to ends of the semiconductor layer 430 that are opposite the ends 432. The drain semiconductor region is further positioned adjacent to the surface 408 of the substrate 416.

The gate 422 controls the flow of current through a channel region from the source region 435 to the drain region 437 via channel regions of transistor 420. The channel regions are created by the gate 422 encompassing the semiconductor layers 430. The gate 422 comprises a gate electrode 463, gate layers 464, gate dielectric layers 466, a gate spacer 468, and cavity spacers 469. The gate spacer 468 and cavity spacers 469 isolate the gate stack (e.g., gate electrode 463, gate layers 464, and gate dielectric layers 466) from adjacent features. The semiconductor layers 430 are positioned between adjacent gate layers 464 and a gate dielectric layer 466 is positioned between a semiconductor layer 430 and a gate layer 464.

In the GAAFET embodiment illustrated in FIGS. 4A-4B, the semiconductor layers 430 do not extend into the source and drain regions 435 and 437. Rather, the source semiconductor region 439 and drain semiconductor region act as the source/drain semiconductor regions for the transistor 420. In other embodiments, the semiconductor layers that extend through the gate of a GAAFET extend into the source and drain regions and source and drain semiconductor regions encompass the semiconductor layers (e.g., FIGS. 5A-5E). In some embodiments, the source semiconductor region 439 and the drain semiconductor region are epitaxially grown on the surface 408 of the substrate 416.

Cross-sectional views 450 and 460 illustrate a contact 454 contacting the source semiconductor region 439. The contact 454 is not shown in FIGS. 4A-4B for ease of illustration. The contact 454 is positioned adjacent to dielectric layer portions 412 and has a similar structure to the contact 154 of FIGS. 1C-1D. The contact 454 comprises a boride, indium, or gallium metal compound layer 428, a contact metal layer 436, and a fill metal layer 440. The dielectric layer 412 isolates the contact 454 from adjacent contacts and/or other features. A portion (bottom portion) 452 of the boride, indium, or gallium metal compound layer 428 is positioned adjacent to the source semiconductor region 439 and portions 456 (sidewall portions) of boride, indium, or gallium metal compound layer 428 are not positioned adjacent to the source semiconductor region 439. In some embodiments, the portions 456 are substantially perpendicular to the portion 452. The portions of a boride, indium, or gallium metal compound layer not positioned adjacent to a source semiconductor region can be positioned adjacent to a dielectric layer (such as dielectric layer 412 as illustrated in FIGS. 4C-4D) or other structures (e.g., gate spacers 468).

The contact metal layer 436 is positioned adjacent to the boride, indium, or gallium metal compound layer 428. The boride, indium, or gallium metal compound layer 428 and the contact metal layer 436 form a contact hole (or cavity) 465 in the dielectric layer 412 and the fill metal layer 440 at least partially fills the hole 465. In some embodiments, the contact 454 comprises a barrier layer positioned between the contact metal layer 436 and the fill metal layer 440.

In some embodiments, a silicide layer 429 is located in a portion of the source semiconductor region 439 positioned adjacent to the boride, indium, or gallium metal compound layer 428 after processing is complete. The silicide layer 429 can be formed in the same manner as silicide layer 129, as described above, and have a similar thickness as the silicide layer 129 (less than 3 nm in some embodiments, and less than 1 nm in other embodiments).

Figure 5B:
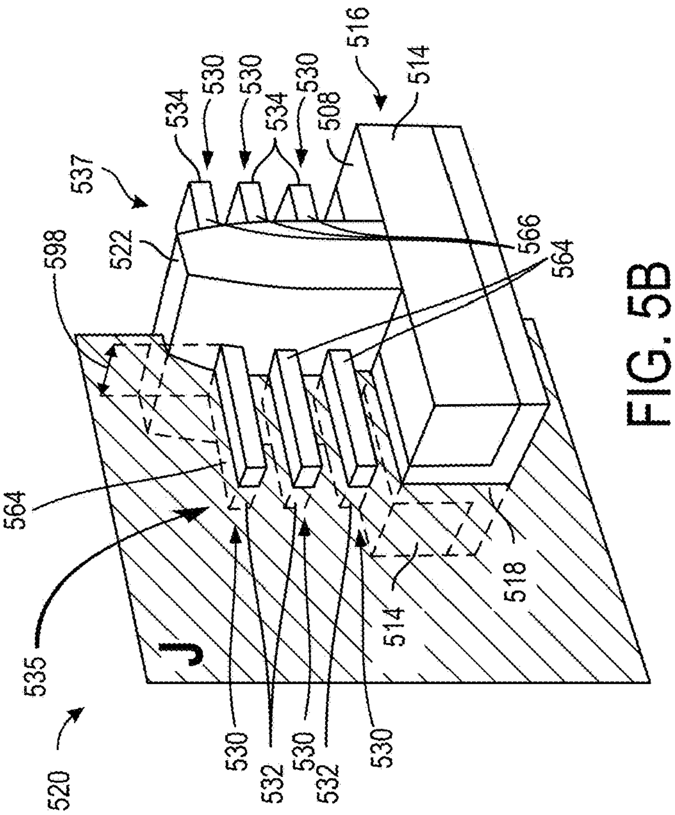
FIGS. 5A-5B illustrate simplified perspective views of a second exemplary GAAFET comprising source/drain contacts with a boride, indium, or gallium metal compound layer.
Figure 5A:
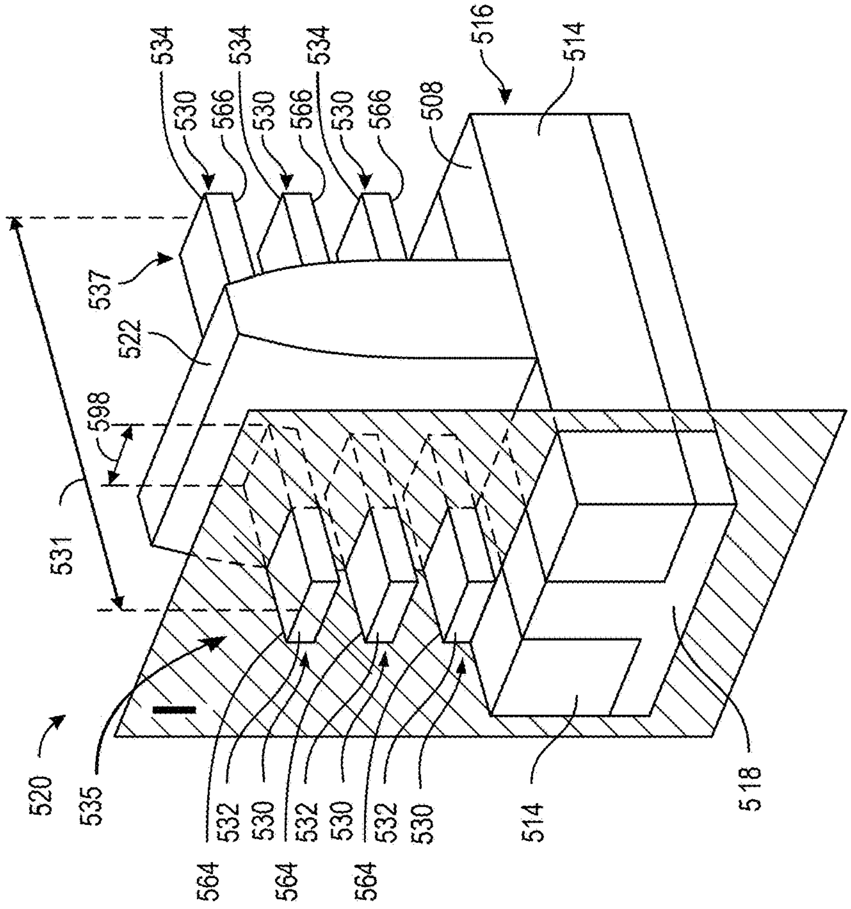
Figures 5C, 5D, 5E:
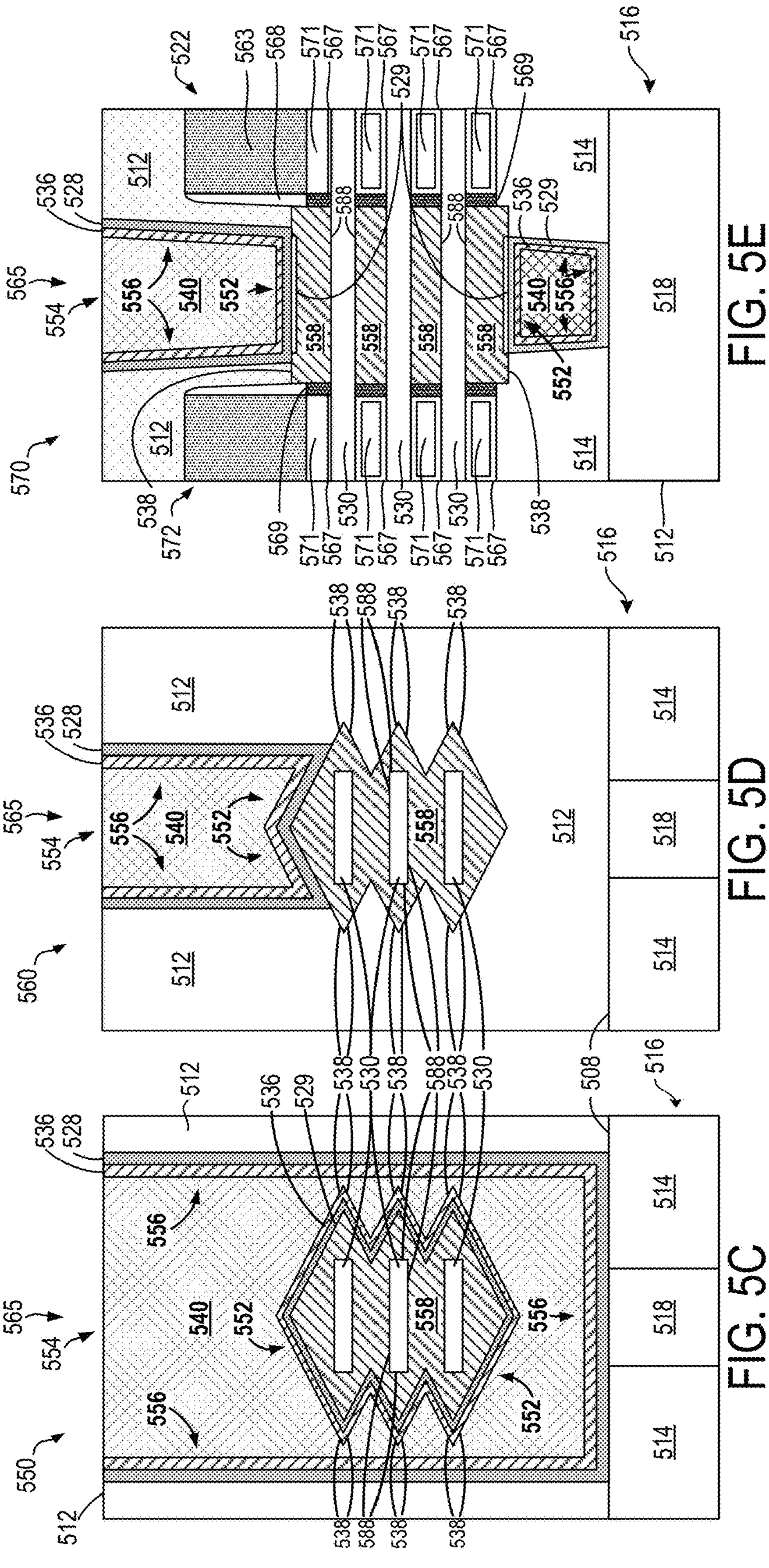
FIGS. 5C-5D are cross-sectional views of the GAAFET of FIGS. 5A-5B taken along plane I of FIG. 5A.
FIG. 5E is a cross-sectional view of the GAAFET of FIGS. 5A-5B taken along plane J of FIG. 5B.

FIGS. 5A-5B illustrate simplified perspective views of a second exemplary GAAFET comprising source/drain contacts with a boride, indium, or gallium metal compound layer. GAAFET 520 comprises a gate 522, a source region 535, a drain region 537, and semiconductor layers 530. The individual semiconductor layers 530 are substantially parallel to the surface 508 of the substrate 516 and extend along a length 531 from a first end 532 of the individual semiconductor layer 530 to a second end 534 of the individual semiconductor layer 530. The semiconductor layers 530 are stacked vertically with respect to the surface 508 of the substrate 516. The transistor 520 is formed on a substrate 516 comprising a surface 508, a bulk region 518, and isolation regions 514. FIGS. 5C-5D are cross-sectional views of the GAAFET 520 taken along plane I of FIG. 5A. Plane I cuts across the source region 535 of GAAFET 520. FIG. 5E is a cross-sectional view of the GAAFET 520 taken along plane J of FIG. 5B. Plane J extends along the source region 535 of transistor 520 in a direction perpendicular to that of plane I (e.g., along the direction of the channel region of the GAAFET 520 from the source region 535 to the drain region 537).

The gate 522 controls the flow of current through multiple channel regions from source portions 564 of the semiconductor layers 530 to drain portions 566 of the semiconductor layers 530. The channel regions of the transistor 520 are formed by the gate 522 encompassing a portion of the individual semiconductor layers 530. The semiconductor layers 530 are located above and separate from the substrate 516 and are substantially parallel to the surface 508 of the substrate 516.

The source region 535 comprises a source semiconductor region 558 (shown in FIGS. 5C-5E, but not FIGS. 5A-5B) positioned adjacent to the source portions 564 of the semiconductor layers 530. The source semiconductor region 558 is further positioned adjacent to the surface 508 of the substrate 516. FIG. 5E illustrates the semiconductor layers 530 and the source semiconductor region 558 positioned between gate 522 and a gate 572 of a second GAAFET (not shown in FIGS. 5A-5B). The drain region 537 comprises drain portions 566 of the semiconductor layers 530 and a drain semiconductor region is positioned adjacent to and encompasses at least a portion of the length 531 of the drain portions 566 of the semiconductor layers 530.

The gate 522 comprises a gate electrode 563, gate layers 571, gate dielectric layers 567, a gate spacer 568, and cavity spacers 569. The gate spacer 568 and cavity spacers 569 isolate the gate stack (e.g., gate electrode 563, gate layers 571, and gate dielectric layers 567) from adjacent features. The channel portions of the semiconductor layers 530 are positioned between adjacent gate layers 571 and a gate dielectric layer 567 is positioned between a semiconductor layer 530 and a gate layer 571.

Cross-sectional views 550, 560, and 570 illustrate a semiconductor region 558 positioned adjacent to the source portions 564 of the semiconductor layers 530. The source semiconductor region 558 can aid in the formation of low resistance source/drain contacts by, for example, providing more source/drain surface area upon which a metal contact can be formed. The source semiconductor region 558 is illustrated as encompassing the source portions 564 of the semiconductor layers 530. That is, the source semiconductor region 558 encompasses the top, bottom, and side surfaces 588 of the semiconductor layers 530 (as viewed in the cross-sectional views 5C-5D). Further, the semiconductor region 558 can extend along all (as illustrated in FIG. 5E) or a portion of the source portion 564 of the semiconductor layers 530. The semiconductor region 558 can be grown epitaxially with in situ doping of one or more p-type dopants (e.g., boron, indium, gallium).

Cross-sectional views 550, 560, and 570 further illustrate a contact 554 contacting the source semiconductor region 558. The contact 554 is not shown in FIGS. 5A-5B for ease of illustration. The contact 554 is positioned adjacent to dielectric layer portions 512 and has a similar structure to the contact 154 of FIGS. 1C-1D. The contact 554 comprises a boride, indium, or gallium metal compound layer 528, a contact metal layer 536, and a fill metal layer 540. The dielectric layer 512 isolates the contact 554 from adjacent contacts and other features. The contact metal layer 536 is positioned adjacent to the boride, indium, or gallium metal compound layer 528. The boride, indium, or gallium metal compound layer 528 and the contact metal layer 536 form a contact hole (or cavity) 565 in the dielectric layer 512 and the fill metal layer 540 at least partially fills the cavity 565. In some embodiments, the contact 554 comprises a barrier layer positioned between the contact metal layer 536 and the fill metal layer 540.

A portion 552 of the boride, indium, or gallium metal compound layer 528 is positioned adjacent to the source semiconductor region 558 and a portion 556 of boride, indium, or gallium metal compound layer 528 is not positioned adjacent to the source semiconductor region 558. The portion of the boride, indium, or gallium metal compound layer 528 not positioned adjacent to the source semiconductor region 558 can be positioned adjacent to a dielectric layer (such as dielectric layer 512 as illustrated in FIGS. 5C-5D) or other structures (e.g., gate spacers 568). As shown in FIG. 5C, the boride, indium, or gallium metal compound layer 528 can comprise portions that are physically separate from each other (e.g., 552, 556).

FIGS. 5C and 5E illustrate an embodiment in which the contact 554 encompasses outer surfaces 538 of the semiconductor region 558. As such, the contact 554 in FIGS. 5C and 5E can be referred to as wrap-around contacts. FIG. 5D illustrates an embodiment in which the contact 554 encompasses a portion of the outer surfaces 538 of the source semiconductor layer 558.

In some embodiments, a silicide layer 529 is located in a portion of the semiconductor region 558 positioned adjacent to the boride, indium, or gallium metal compound layer 528 after completion of processing. The silicide layer 529 can be formed in the same manner as silicide layer 129, as described above, and have a similar thickness as the silicide layer 129 (less than 5 nm in some embodiments, and less than 1 nm in other embodiments). For ease of illustration, the silicide 529 is only shown in the cross-sectional view of FIG. 5E.

The transistors 420 and 520 are non-planar in that the semiconductor layers (430, 530) are located above and are separate from the substrate (416, 516). The transistors 420 and 520 are considered gate-all-around transistors as the gate (422, 522) encompasses the channel portion of the semiconductor layers (430, 530).

GAAFETs can be alternatively referred to as nanowire or nanoribbon transistors, depending on a width (e.g., 498, 598) of the semiconductor layer (e.g., 430, 530) extending through the gate (e.g., 422, 522) relative to the thickness of the semiconductor layer. For example, as the width 498 of the semiconductor layer 430 in FIGS. 4A-4B is greater than the thickness of the semiconductor layer 430, GAAFET 420 can be referred to as a nanoribbon transistor. GAAFETs in which the width and thickness of the semiconductor are similar can be referred to as nanowire transistors.

Figures 6A, 6B, 6C:
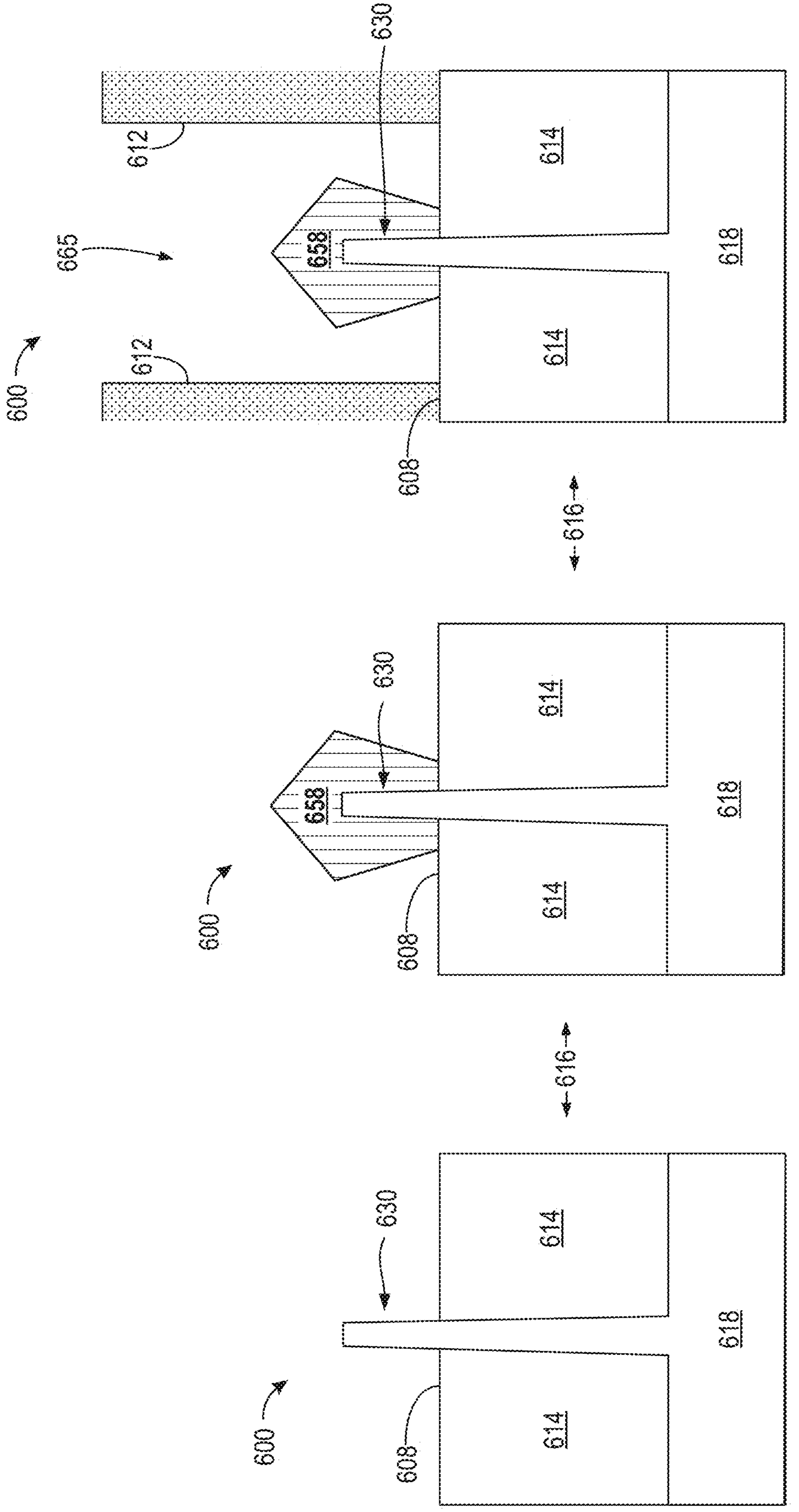
FIGS. 6A-6F illustrate an example simplified process sequence for forming a contact with a boride, indium, or gallium metal compound layer.

FIGS. 6A-6F illustrate an example simplified process sequence for forming a contact comprising a boride, indium, or gallium metal compound layer. FIG. 6A illustrates a structure 600 comprising a fin 630 extending from a surface 608 of a substrate 616 comprising a bulk region 618 and isolation regions 614. FIG. 6B illustrates the structure 600 after formation of an epitaxially-grown semiconductor region 658 positioned adjacent to the portion of the fin 630 extending beyond the surface 608 of the substrate 616. The semiconductor region 658 can be epitaxially grown with in situ doping of one or more p-type dopants. FIG. 6C illustrates the structure 600 after the formation of a dielectric layer 612 and etching of the dielectric layer 612 to form a contact hole (cavity) 665. The etching of the dielectric layer 612 exposes the p-type semiconductor region 658.

Figure 6F:
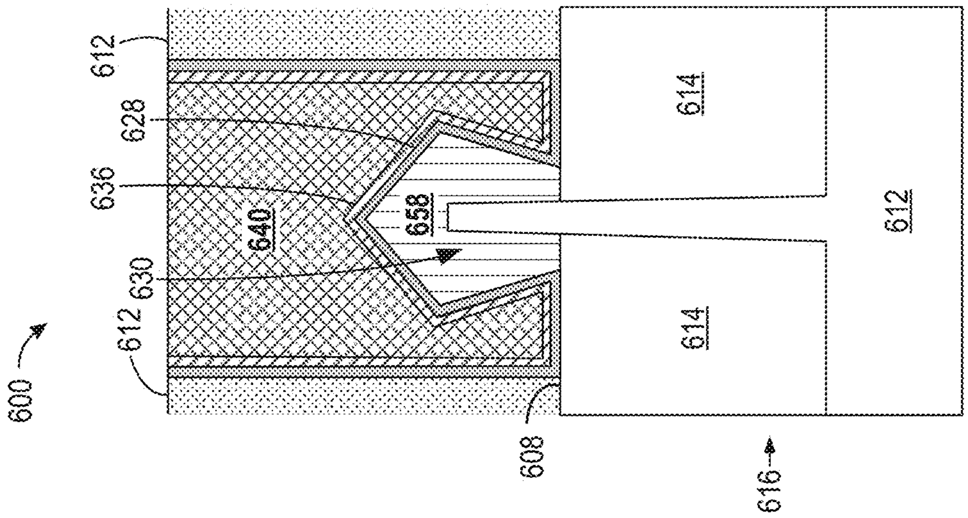
Figure 6E:
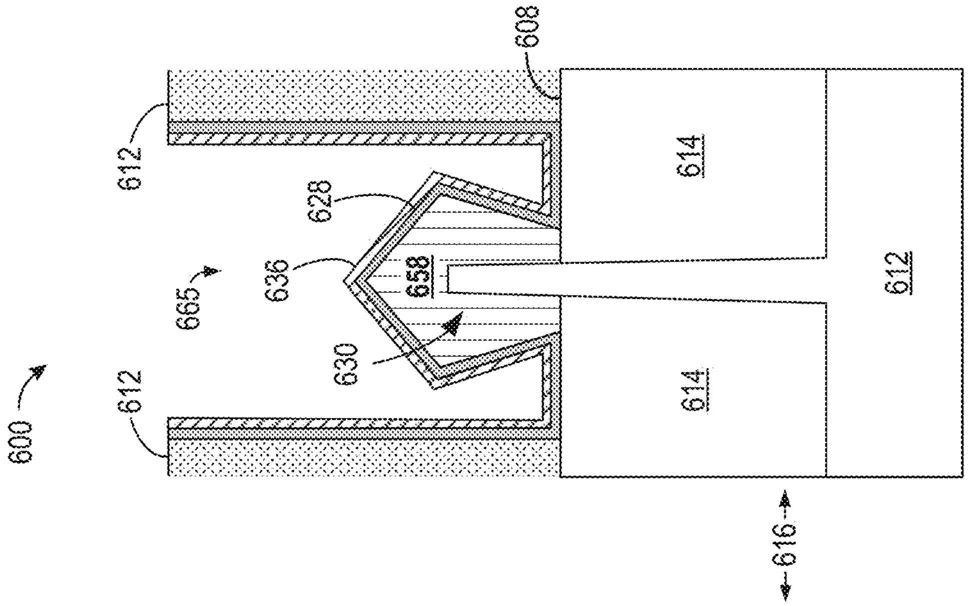
Figure 6D:
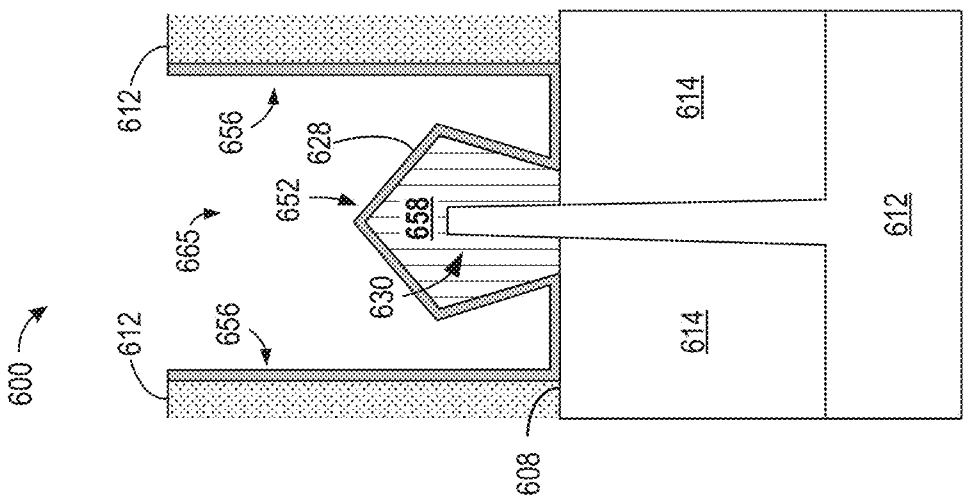

FIG. 6D illustrates the structure 600 after the formation of a boride, indium, or gallium metal compound layer 628. A first portion 652 of the boride, indium, or gallium metal compound layer is positioned adjacent to the p-type semiconductor region 658 and a second portion 656 of the boride, indium, or gallium metal compound layer is positioned adjacent to one or more sidewalls of the contact hole (e.g., positioned adjacent to dielectric layer portions 612). FIG. 6E illustrates the structure 600 after formation of a metal contact layer 636 positioned adjacent to the boride, indium, or gallium metal compound layer 628. FIG. 6F illustrates the structure 600 after filling the contact hole 665 with fill metal layer 640. The fill metal at least partially fills the contact hole 665 and is located on the metal contact layer 636. The boride, indium, or gallium metal compound layer, metal contact layer, and fill metal layers of the contacts described herein can be formed by any thin layer formation process, such as chemical vapor deposition (CVD), plasma-enhanced chemical vapor deposition (PECVD), physical vapor deposition (e.g., such as sputtering), or another suitable deposition process. In some embodiments, the contact formation process illustrated in FIGS. 6A-6F can comprise additional steps, such as forming a barrier layer after forming the metal contact layer 636 and before forming the fill metal layer 640. The barrier layer can be positioned between the metal contact layer 636 and the fill metal layer 640.

Although FIGS. 1C-1D, 2C-2D, 3C-3E, 4C-4D, and 5C-5E illustrate cross-sectional views of a contact comprising a boride, indium, or gallium metal compound layer contacting a transistor source region, the contacts described herein can similarly contact to transistor drain regions.

The various layers, regions, contacts, transistors, and other structures described or referenced herein can comprise various materials as follows. The bulk region of a substrate upon which transistors are fabricated and to which a contact comprising a boride, indium, or gallium metal compound layer can contact the source/drain regions of the transistors (e.g., substrate 116, 216, 316, 416, 516, 616) can comprise a semiconductor comprising silicon (e.g., bulk silicon, silicon-on-insulator (e.g., bulk silicon with a buried silicon dioxide layer)), silicon and germanium (e.g., silicon germanium), or another suitable semiconductor.

A fin (e.g., 230, 330, 630) of a FinFET, a source or drain semiconductor region (e.g., 239, 358, 439, 558, 658) or any of the semiconductor layers (e.g., 430, 530) positioned above the substrate and forming the channel regions of a GAAFET (GAAFET semiconductor layer) can comprise silicon, silicon and germanium, or another suitable semiconductor. A fin or a GAAFET semiconductor layer can comprise one or more p-type dopants, such as boron, indium, gallium, or another suitable p-type dopant. A fin or GAAFET semiconductor layer can comprise one or more different p-type dopants in different portions of the fin or GAAFET semiconductor layer. For example, the channel region of a fin or GAAFET semiconductor layer can comprise one or more different dopants than source portions or drain portions of the fin or GAAFET semiconductor layer.

A source or drain semiconductor region (e.g., 239, 358, 439, 558, 658) can comprise one or more p-type dopants, such as boron, indium, gallium, or another suitable p-type dopant. In some embodiments, the source semiconductor region and the drain semiconductor region can be epitaxially grown. The p-type dopants can be introduced via in situ doping in epitaxially grown source or drain semiconductor regions.

The transistors to which contacts comprising a boride, indium, or gallium metal compound layer contact are PMOS devices (a MOSFET with p-type source/drain regions). As such, the source/drain regions to which contacts comprising a boride, indium, or gallium metal compound layer contact (e.g., source/drain regions 104, 106, source semiconductor regions 239, 358, 439, 558, 658) are heavily doped with at least one p-type dopant, such as boron, indium, or gallium.

In embodiments where the boride, indium, or gallium metal compound layer (e.g., layer 128, 228, 328, 428, 528) is a boride metal compound layer, the boride metal compound layer comprises boron and a metal, such as boron and cobalt (CoB, cobalt boride), boron and lanthanum (e.g., $LaB_6$, lanthanum hexaboride), boron and nickel (e.g., $Ni_2B$, nickel boride), boron and tantalum (e.g., TaB, tantalum boride), boron and tungsten (e.g., WB, tungsten boride), boron and zirconium ($ZrB_2$, zirconium boride), or other suitable boride metal compound.

In embodiments where the boride, indium, or gallium metal compound layer is an indium metal compound layer, the indium metal compound layer comprises indium and one or more other elements, such as indium and antimony (e.g., InSb, indium antimonide); indium, gallium, and nitrogen (e.g., InGaN, indium gallium nitride); or another suitable indium metal compound.

In embodiments where the boride, indium, or gallium metal compound layer is a gallium metal compound layer, the gallium metal compound layer comprises gallium and one or more other elements, such as gallium and antimony (e.g., GaSb, gallium antimonide); gallium, indium and nitrogen (e.g., InGaN, indium gallium nitride); gallium and nitrogen (GaN, gallium nitride), or another suitable gallium metal compound. In some embodiments, the thickness of a boride, indium, or gallium metal compound layer is in the range of 0.5-2.0 nm.

Although FIGS. 1C-1D, 2C-2D, 3C-3E, 4C-4D, and 5C-5E illustrate a contact contacting to source/drain regions of a transistor, the contacts described herein comprising a boride, indium, or gallium metal compound layer can contact to any p-type semiconductor region to create a low resistance contact that is thermally stable.

In some embodiments, the peak concentration of boron, indium, or gallium in the boride, indium, or gallium metal compound layer, even after completion of BEOL processing is $1\times10^{22}$ $cm^{-3}$ or greater. This peak concentration is greater than the peak concentration of p-type dopants (e.g., boron, indium, gallium) in the source/drain regions prior to contact formation, which can be on the order of $10^{21}$ $cm^{-3}$. As discussed previously, the boron, indium, or gallium in the boride, indium, or gallium metal compound layer can diffuse into the source/drain region due to the high-temperature processing steps that occur in a semiconductor manufacturing process after contact formation. Thus, a pile-up of boron, indium, or gallium can occur at the boride, indium, or gallium metal compound layer-source/drain region interface after BEOL processing in which the boron, indium, or gallium concentration in the source/drain increases in a direction from the interior of the source/drain toward the boride, indium, or gallium metal compound layer-source/drain region interface.

Contact metal layer 136 can comprise titanium, tantalum, hafnium, zirconium, niobium, or other suitable metal. Fill metal layer 140 can comprise tungsten, cobalt, titanium, gold, aluminum, molybdenum, chromium, nickel, or other suitable metal.

The isolation regions isolating adjacent transistors from each other (e.g., 114, 214, 314, 414, 514, 614) can comprise silicon dioxide ($SiO_2$, a material comprising silicon and oxide) or any other suitable oxide, nitride, or any other material suitable for providing electrical isolation between adjacent transistors. The isolation regions isolating source contact metals or drain contact metals from the substrate or other contact metals (e.g., 112, 212, 312, 412, 512, 612) can be a suitable nitride or oxide, such as silicon dioxide ($SiO_2$), carbon-doped silicon dioxide (C-doped $SiO_2$, also known as CDO or organosilicate glass, which is a material that comprises silicon, oxygen, and carbon), fluorine-doped silicon dioxide (F-doped $SiO_2$, also known as fluorosilicate glass, which is a material that comprises fluorine, silicon, and oxygen), hydrogen-doped silicon dioxide (H-doped $SiO_2$, which is a material that comprises silicon, oxygen, and hydrogen), or silicon nitride ($Si_3N_4$, which is a material that comprises silicon and nitrogen).

The gate dielectric layers (e.g., 166, 266, 366, 466, 567) can comprise any of the gate dielectric materials discussed below in regard to FIG. 9. The gate electrode layers (e.g., 164, 264, 364, 463, 563) and gate layers (e.g., 464, 571) can comprise one or more of the gate electrode materials discussed below in regard to FIG. 9.

In some embodiments, one or more barrier layers can be positioned between a metal contact layer and a fill metal layer. The barrier layer can reduce the amount of metal that diffuses from the fill metal layer to a source/drain region and/or prevent or reduce oxidation of the contact metal layer between formation of the contact metal layer and formation of the fill metal layer. A barrier layer can comprise cobalt (Co), ruthenium (Ru), tantalum (Ta), tantalum nitride (which is a material comprising tantalum and nitrogen (e.g., TaN, $Ta_2N$, $Ta_3N_5$)), indium oxide ($In_2O_3$, which is a material that comprises indium and oxygen), tungsten nitride (which is a material that comprises tungsten and nitrogen (e.g., $W_2N$, WN, $WN_2$)), titanium nitride (TiN, which is a material that comprises titanium and nitrogen), or other suitable material.

Figure 7:
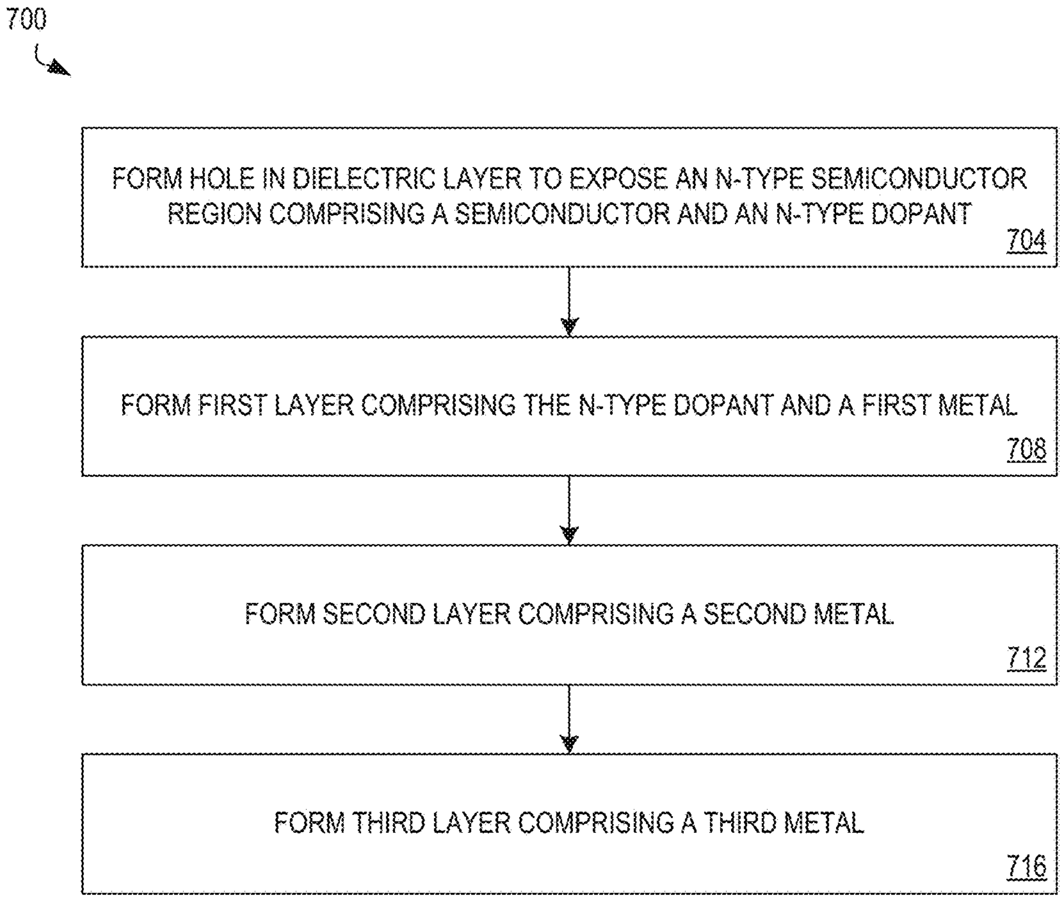
FIG. 7 is an exemplary method of forming a contact with a boride, indium, or gallium metal compound layer.

FIG. 7 is an exemplary method of forming a contact with a boride, indium, or gallium metal compound layer. The method 700 can be performed, for example, by a semiconductor manufacturer. At 704, a hole in a dielectric layer located on a substrate is formed to expose a p-type semiconductor region comprising a semiconductor and a p-type dopant. At 708, a first layer comprising the p-type dopant and a first metal is formed. A first portion of the first layer is positioned adjacent to the p-type semiconductor and a second portion of the first layer is positioned adjacent to one or more sidewalls of the contact hole. At 712, a second layer comprising a second metal is formed, the second layer positioned adjacent to the first layer. At 716, a third layer comprising a third metal is formed, the third layer located on the second layer and at least partially filling the hole. The method 700 can comprise additional elements. For example, the method 700 can further comprise forming a fourth layer positioned between the second layer and third layer.

The contacts described herein can be used in any processor unit or integrated circuit component described or referenced herein. An integrated circuit component comprising any of the contacts described herein can be attached to a printed circuit board (motherboard, mainboard). In some embodiments, one or more additional integrated circuit components or other components (e.g., battery, antenna) can be attached to the printed circuit board. In some embodiments, the printed circuit board and the integrated circuit component can be located in a computing device that comprises a housing that encloses the printed circuit board and the integrated circuit component.

Figure 8:
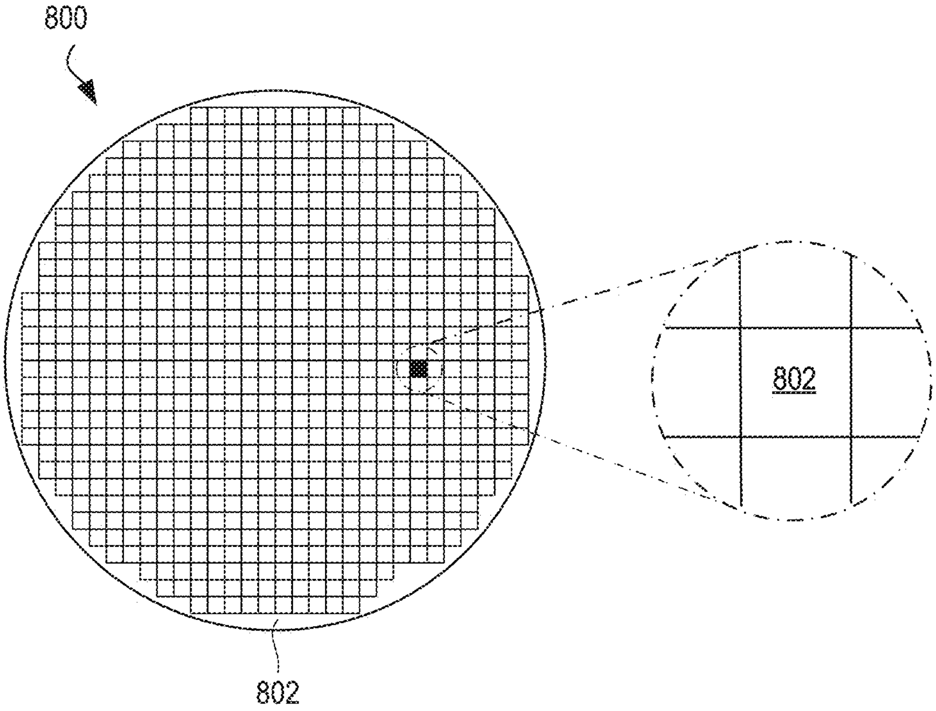
FIG. 8 is a top view of a wafer and dies that may be included in a microelectronic assembly, in accordance with any of the embodiments disclosed herein.

FIG. 8 is a top view of a wafer 800 and dies 802 that may include any of the contacts disclosed herein. The wafer 800 may be composed of semiconductor material and may include one or more dies 802 having integrated circuit structures formed on a surface of the wafer 800. The individual dies 802 may be a repeating unit of an integrated circuit product that includes any suitable integrated circuit. After the fabrication of the semiconductor product is complete, the wafer 800 may undergo a singulation process in which the dies 802 are separated from one another to provide discrete "chips" of the integrated circuit product. The die 802 may include one or more transistors (e.g., some of the transistors 940 of FIG. 9, discussed below), supporting circuitry to route electrical signals to the transistors, passive components (e.g., signal traces, resistors, capacitors, or inductors), and/or any other integrated circuit components. In some embodiments, the wafer 800 or the die 802 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 802. For example, a memory array formed by multiple memory devices may be formed on a same die 802 as a processor unit (e.g., the processor unit 1102 of FIG. 11) or other logic that is configured to store information in the memory devices or execute instructions stored in the memory array.

Figure 9:
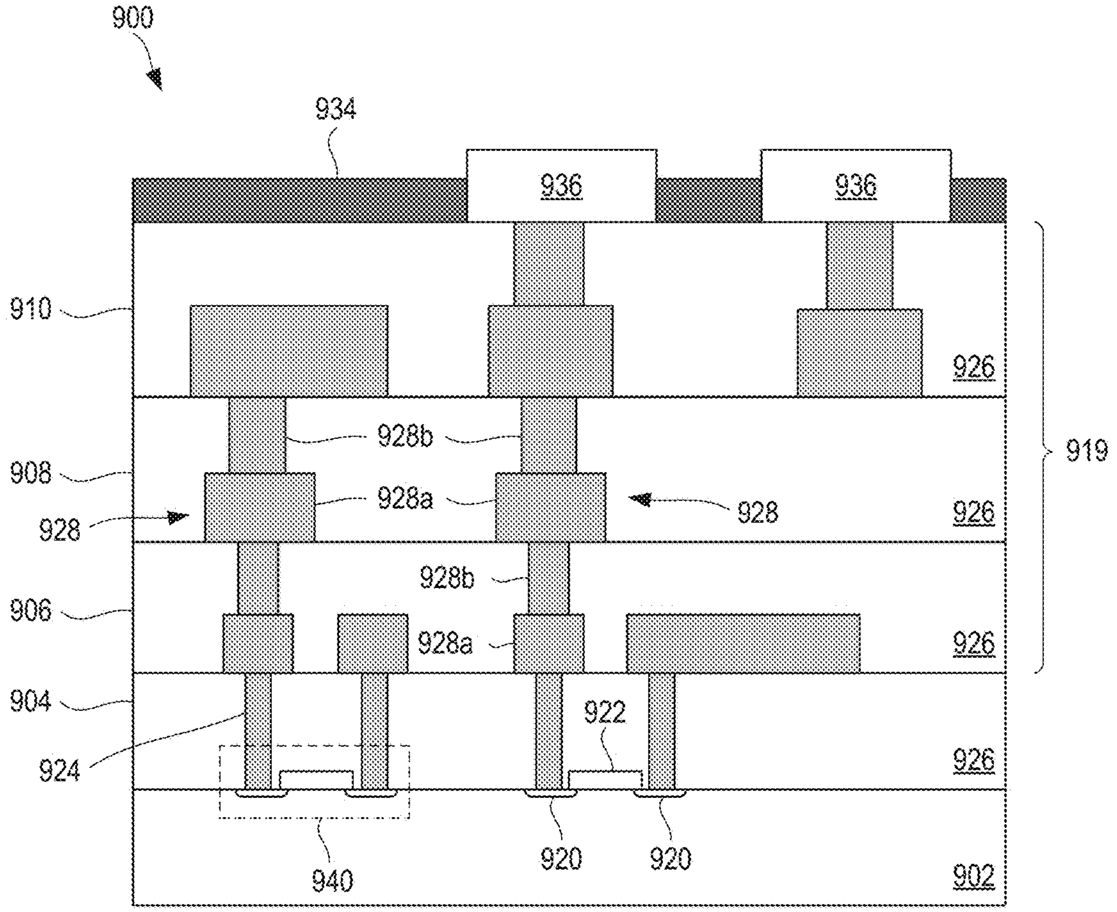
FIG. 9 is a cross-sectional side view of an integrated circuit device that may be included in a microelectronic assembly, in accordance with any of the embodiments disclosed herein.

FIG. 9 is a cross-sectional side view of an integrated circuit device 900 that may be included in any of the microelectronic assemblies disclosed herein. One or more of the integrated circuit devices 900 may be included in one or more dies 802 (FIG. 8). The integrated circuit device 900 may be formed on a die substrate 902 (e.g., the wafer 800 of FIG. 8) and may be included in a die (e.g., the die 802 of FIG. 8). The die substrate 902 may be a semiconductor substrate composed of semiconductor material systems including, for example, p-type or n-type materials systems (or a combination of both). The die substrate 902 may include, for example, a crystalline substrate formed using a bulk silicon or a silicon-on-insulator (SOI) substructure. In some embodiments, the die substrate 902 may be formed using alternative materials, which may or may not be combined with silicon, that include, but are not limited to, germanium, indium antimonide, lead telluride, indium arsenide, indium phosphide, gallium arsenide, gallium antimonide, or carbon. Further materials classified as group II-VI, III-V, or IV may also be used to form the die substrate 902. Although a few examples of materials from which the die substrate 902 may be formed are described here, any material that may serve as a foundation for an integrated circuit device 900 may be used. The die substrate 902 may be part of a singulated die (e.g., the dies 802 of FIG. 8) or a wafer (e.g., the wafer 800 of FIG. 8).

The integrated circuit device 900 may include one or more device layers 904 disposed on the die substrate 902. The device layer 904 may include features of one or more transistors 940 (e.g., metal oxide semiconductor field-effect transistors (MOSFETs)) formed on the die substrate 902. The transistors 940 may include, for example, one or more source and/or drain (S/D) regions 920, a gate 922 to control current flow between the S/D regions 920, and one or more S/D contacts 924 to route electrical signals to/from the S/D regions 920. The transistors 940 may include additional features not depicted for the sake of clarity, such as device isolation regions, gate contacts, and the like. The transistors 940 are not limited to the type and configuration depicted in FIG. 9 and may include a wide variety of other types and configurations such as, for example, planar transistors (e.g., transistor 100), non-planar transistors, or a combination of both. Non-planar transistors may include FinFET transistors (e.g., transistors 220, 320), such as double-gate transistors or tri-gate transistors, and wrap-around or all-around gate transistors (e.g., transistors 420, 520), such as nanoribbon, nanosheet, or nanowire transistors.

A transistor 940 may include a gate 922 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 940 is to be a p-type metal oxide semiconductor (PMOS) or a n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 940 along the source-channel-drain direction, the gate electrode may consist of a U-shaped structure that includes a bottom portion substantially parallel to the surface of the die substrate 902 and two sidewall portions that are substantially perpendicular to the top surface of the die substrate 902. In other embodiments, at least one of the metal layers that form the gate electrode may simply be a planar layer that is substantially parallel to the top surface of the die substrate 902 and does not include sidewall portions substantially perpendicular to the top surface of the die substrate 902. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 920 may be formed within the die substrate 902 adjacent to the gate 922 of individual transistors 940. The S/D regions 920 may be formed using an implantation/diffusion process or an etching/deposition process, for example. In the former process, dopants such as boron, aluminum, antimony, phosphorous, or arsenic may be ion-implanted into the die substrate 902 to form the S/D regions 920. An annealing process that activates the dopants and causes them to diffuse farther into the die substrate 902 may follow the ion-implantation process. In the latter process, the die substrate 902 may first be etched to form recesses at the locations of the S/D regions 920. An epitaxial deposition process may then be carried out to fill the recesses with material that is used to fabricate the S/D regions 920. In some implementations, the S/D regions 920 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 920 may be formed using one or more alternate semiconductor materials such as germanium or a group III-V material or alloy. In further embodiments, one or more layers of metal and/or metal alloys may be used to form the S/D regions 920.

Electrical signals, such as power and/or input/output (I/O) signals, may be routed to and/or from the devices (e.g., transistors 940) of the device layer 904 through one or more interconnect layers disposed on the device layer 904 (illustrated in FIG. 9 as interconnect layers 906-910). For example, electrically conductive features of the device layer 904 (e.g., the gate 922 and the S/D contacts 924) may be electrically coupled with the interconnect structures 928 of the interconnect layers 906-910. The one or more interconnect layers 906-910 may form a metallization stack (also referred to as an "ILD stack") 919 of the integrated circuit device 900.

The interconnect structures 928 may be arranged within the interconnect layers 906-910 to route electrical signals according to a wide variety of designs; in particular, the arrangement is not limited to the particular configuration of interconnect structures 928 depicted in FIG. 9. Although a particular number of interconnect layers 906-910 is depicted in FIG. 9, embodiments of the present disclosure include integrated circuit devices having more or fewer interconnect layers than depicted.

In some embodiments, the interconnect structures 928 may include lines **928*a* and/or vias 928*b* filled with an electrically conductive material such as a metal. The lines 928*a* may be arranged to route electrical signals in a direction of a plane that is substantially parallel with a surface of the die substrate 902 upon which the device layer 904 is formed. For example, the lines 928*a* may route electrical signals in a direction in and out of the page and/or in a direction across the page from the perspective of FIG. 9. The vias 928*b* may be arranged to route electrical signals in a direction of a plane that is substantially perpendicular to the surface of the die substrate 902 upon which the device layer 904 is formed. In some embodiments, the vias 928*b* may electrically couple lines 928*a* of different interconnect layers 906-910** together.

The interconnect layers 906-910 may include a dielectric material 926 disposed between the interconnect structures 928, as shown in FIG. 9. In some embodiments, dielectric material 926 disposed between the interconnect structures 928 in different ones of the interconnect layers 906-910 may have different compositions; in other embodiments, the composition of the dielectric material 926 between different interconnect layers 906-910 may be the same. The device layer 904 may include a dielectric material 926 disposed between the transistors 940 and a bottom layer of the metallization stack as well. The dielectric material 926 included in the device layer 904 may have a different composition than the dielectric material 926 included in the interconnect layers 906-910; in other embodiments, the composition of the dielectric material 926 in the device layer 904 may be the same as a dielectric material 926 included in any one of the interconnect layers 906-910.

A first interconnect layer 906 (referred to as Metal 1 or "M1") may be formed directly on the device layer 904. In some embodiments, the first interconnect layer 906 may include lines 928*a* and/or vias 928*b*, as shown. The lines 928*a* of the first interconnect layer 906 may be coupled with contacts (e.g., the S/D contacts 924) of the device layer 904. The vias 928*b* of the first interconnect layer 906 may be coupled with the lines 928*a* of a second interconnect layer 908.

The second interconnect layer 908 (referred to as Metal 2 or "M2") may be formed directly on the first interconnect layer 906. In some embodiments, the second interconnect layer 908 may include vias 928*b* to couple the lines 928*a* of the second interconnect layer 908 with the lines 928*a* of a third interconnect layer 910. Although the lines 928*a* and the vias 928*b* are structurally delineated with a line within individual interconnect layers for the sake of clarity, the lines 928*a* and the vias 928*b* may be structurally and/or materially contiguous (e.g., simultaneously filled during a dual-damascene process) in some embodiments.

The third interconnect layer 910 (referred to as Metal 3 or "M3") (and additional interconnect layers, as desired) may be formed in succession on the second interconnect layer 908 according to similar techniques and configurations described in connection with the second interconnect layer 908 or the first interconnect layer 906. In some embodiments, the interconnect layers that are "higher up" in the metallization stack 919 in the integrated circuit device 900 (i.e., farther away from the device layer 904) may be thicker than the interconnect layers that are lower in the metallization stack 919, with lines 928*a* and vias 928*b* in the higher interconnect layers being thicker than those in the lower interconnect layers.

The integrated circuit device 900 may include a solder resist material 934 (e.g., polyimide or similar material) and one or more conductive contacts 936 formed on the interconnect layers 906-910. In FIG. 9, the conductive contacts 936 are illustrated as taking the form of bond pads. The conductive contacts 936 may be electrically coupled with the interconnect structures 928 and configured to route the electrical signals of the transistor(s) 940 to external devices. For example, solder bonds may be formed on the one or more conductive contacts 936 to mechanically and/or electrically couple an integrated circuit die including the integrated circuit device 900 with another component (e.g., a printed circuit board). The integrated circuit device 900 may include additional or alternate structures to route the electrical signals from the interconnect layers 906-910; for example, the conductive contacts 936 may include other analogous features (e.g., posts) that route the electrical signals to external components.

In some embodiments in which the integrated circuit device 900 is a double-sided die, the integrated circuit device 900 may include another metallization stack (not shown) on the opposite side of the device layer(s) 904. This metallization stack may include multiple interconnect layers as discussed above with reference to the interconnect layers 906-910, to provide conductive pathways (e.g., including conductive lines and vias) between the device layer(s) 904 and additional conductive contacts (not shown) on the opposite side of the integrated circuit device 900 from the conductive contacts 936.

In other embodiments in which the integrated circuit device 900 is a double-sided die, the integrated circuit device 900 may include one or more through silicon vias (TSVs) through the die substrate 902; these TSVs may make contact with the device layer(s) 904, and may provide conductive pathways between the device layer(s) 904 and additional conductive contacts (not shown) on the opposite side of the integrated circuit device 900 from the conductive contacts 936. In some embodiments, TSVs extending through the substrate can be used for routing power and ground signals from conductive contacts on the opposite side of the integrated circuit device 900 from the conductive contacts 936 to the transistors 940 and any other components integrated into the die 900, and the metallization stack 919 can be used to route I/O signals from the conductive contacts 936 to transistors 940 and any other components integrated into the die 900.

Multiple integrated circuit devices 900 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 10:
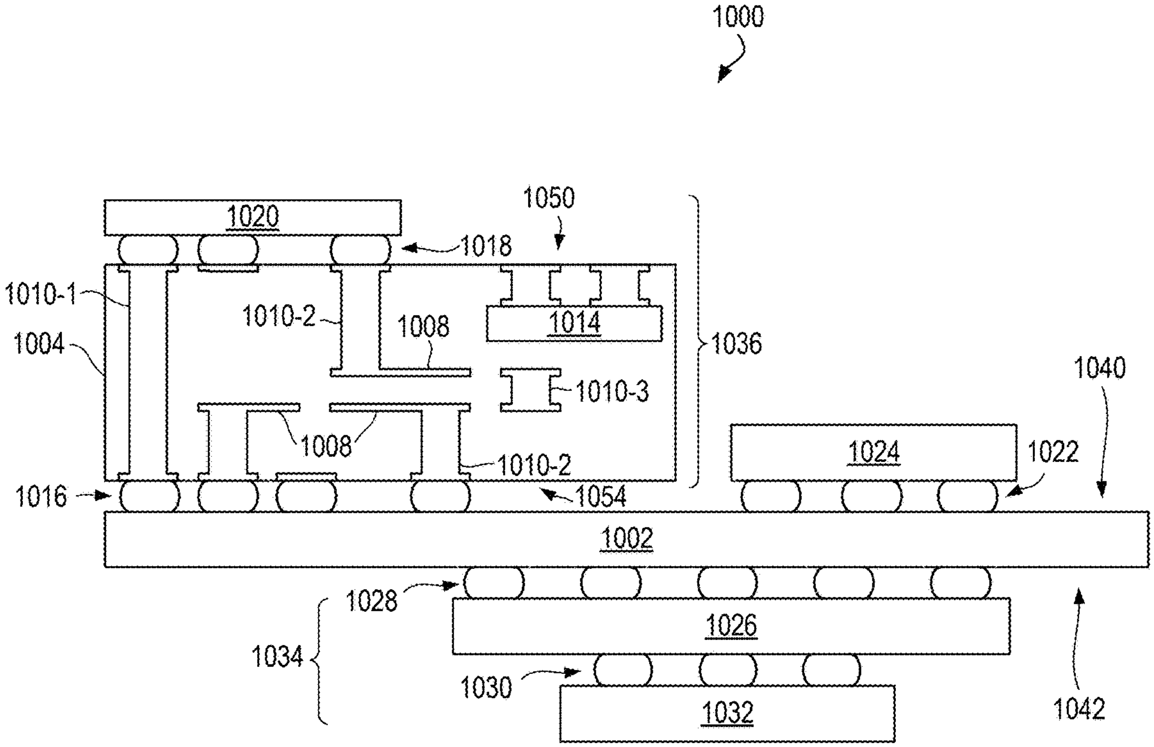
FIG. 10 is a cross-sectional side view of an integrated circuit device assembly that may include a microelectronic assembly, in accordance with any of the embodiments disclosed herein.

FIG. 10 is a cross-sectional side view of an integrated circuit device assembly 1000 that may include any of the microelectronic assemblies disclosed herein. The integrated circuit device assembly 1000 includes a number of components disposed on a circuit board 1002 (which may be a motherboard, system board, mainboard, etc.). The integrated circuit device assembly 1000 includes components disposed on a first face 1040 of the circuit board 1002 and an opposing second face 1042 of the circuit board 1002; generally, components may be disposed on one or both faces 1040 and 1042.

In some embodiments, the circuit board 1002 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1002. In other embodiments, the circuit board 1002 may be a non-PCB substrate. The integrated circuit device assembly 1000 illustrated in FIG. 10 includes a package-on-interposer structure 1036 coupled to the first face 1040 of the circuit board 1002 by coupling components 1016. The coupling components 1016 may electrically and mechanically couple the package-on-interposer structure 1036 to the circuit board 1002, and may include solder balls (as shown in FIG. 10), pins (e.g., as part of a pin grid array (PGA)), contacts (e.g., as part of a land grid array (LGA)), male and female portions of a socket, an adhesive, an underfill material, and/or any other suitable electrical and/or mechanical coupling structure. The coupling components 1016 may serve as the coupling components illustrated or described for any of the substrate assembly or substrate assembly components' described herein, as appropriate.

The package-on-interposer structure 1036 may include an integrated circuit component 1020 coupled to an interposer 1004 by coupling components 1018. The coupling components 1018 may take any suitable form for the application, such as the forms discussed above with reference to the coupling components 1016. Although a single integrated circuit component 1020 is shown in FIG. 10, multiple integrated circuit components may be coupled to the interposer 1004; indeed, additional interposers may be coupled to the interposer 1004. The interposer 1004 may provide an intervening substrate used to bridge the circuit board 1002 and the integrated circuit component 1020.

The integrated circuit component 1020 may be a packaged or unpackaged integrated circuit product that includes one or more integrated circuit dies (e.g., the die 802 of FIG. 8, the integrated circuit device 900 of FIG. 9) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1020, a single monolithic integrated circuit die comprises solder bumps attached to contacts on the die. The solder bumps allow the die to be directly attached to the interposer 1004. The integrated circuit component 1020 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1020 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1020 comprises multiple integrated circuit dies, the dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1020 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1004 may spread connections to a wider pitch or reroute a connection to a different connection. For example, the interposer 1004 may couple the integrated circuit component 1020 to a set of ball grid array (BGA) conductive contacts of the coupling components 1016 for coupling to the circuit board 1002. In the embodiment illustrated in FIG. 10, the integrated circuit component 1020 and the circuit board 1002 are attached to opposing sides of the interposer 1004; in other embodiments, the integrated circuit component 1020 and the circuit board 1002 may be attached to a same side of the interposer 1004. In some embodiments, three or more components may be interconnected by way of the interposer 1004.

In some embodiments, the interposer 1004 may be formed as a PCB, including multiple metal layers separated from one another by layers of dielectric material and interconnected by electrically conductive vias. In some embodiments, the interposer 1004 may be formed of an epoxy resin, a fiberglass-reinforced epoxy resin, an epoxy resin with inorganic fillers, a ceramic material, or a polymer material such as polyimide. In some embodiments, the interposer 1004 may be formed of alternate rigid or flexible materials that may include the same materials described above for use in a semiconductor substrate, such as silicon, germanium, and other group III-V and group IV materials. The interposer 1004 may include metal interconnects 1008 and vias 1010, including but not limited to through hole vias 1010-1 (that extend from a first face 1050 of the interposer 1004 to a second face 1054 of the interposer 1004), blind vias 1010-2 (that extend from the first or second faces 1050 or 1054 of the interposer 1004 to an internal metal layer), and buried vias 1010-3 (that connect internal metal layers).

In some embodiments, the interposer 1004 can comprise a silicon interposer. Through silicon vias (TSV) extending through the silicon interposer can connect connections on a first face of a silicon interposer to an opposing second face of the silicon interposer. In some embodiments, an interposer 1004 comprising a silicon interposer can further comprise one or more routing layers to route connections on a first face of the interposer 1004 to an opposing second face of the interposer 1004.

The interposer 1004 may further include embedded devices 1014, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1004. The package-on-interposer structure 1036 may take the form of any of the package-on-interposer structures known in the art.

The integrated circuit device assembly 1000 may include an integrated circuit component 1024 coupled to the first face 1040 of the circuit board 1002 by coupling components 1022. The coupling components 1022 may take the form of any of the embodiments discussed above with reference to the coupling components 1016, and the integrated circuit component 1024 may take the form of any of the embodiments discussed above with reference to the integrated circuit component 1020.

The integrated circuit device assembly 1000 illustrated in FIG. 10 includes a package-on-package structure 1034 coupled to the second face 1042 of the circuit board 1002 by coupling components 1028. The package-on-package structure 1034 may include an integrated circuit component 1026 and an integrated circuit component 1032 coupled together by coupling components 1030 such that the integrated circuit component 1026 is disposed between the circuit board 1002 and the integrated circuit component 1032. The coupling components 1028 and 1030 may take the form of any of the embodiments of the coupling components 1016 discussed above, and the integrated circuit components 1026 and 1032 may take the form of any of the embodiments of the integrated circuit component 1020 discussed above. The package-on-package structure 1034 may be configured in accordance with any of the package-on-package structures known in the art.

Figure 11:
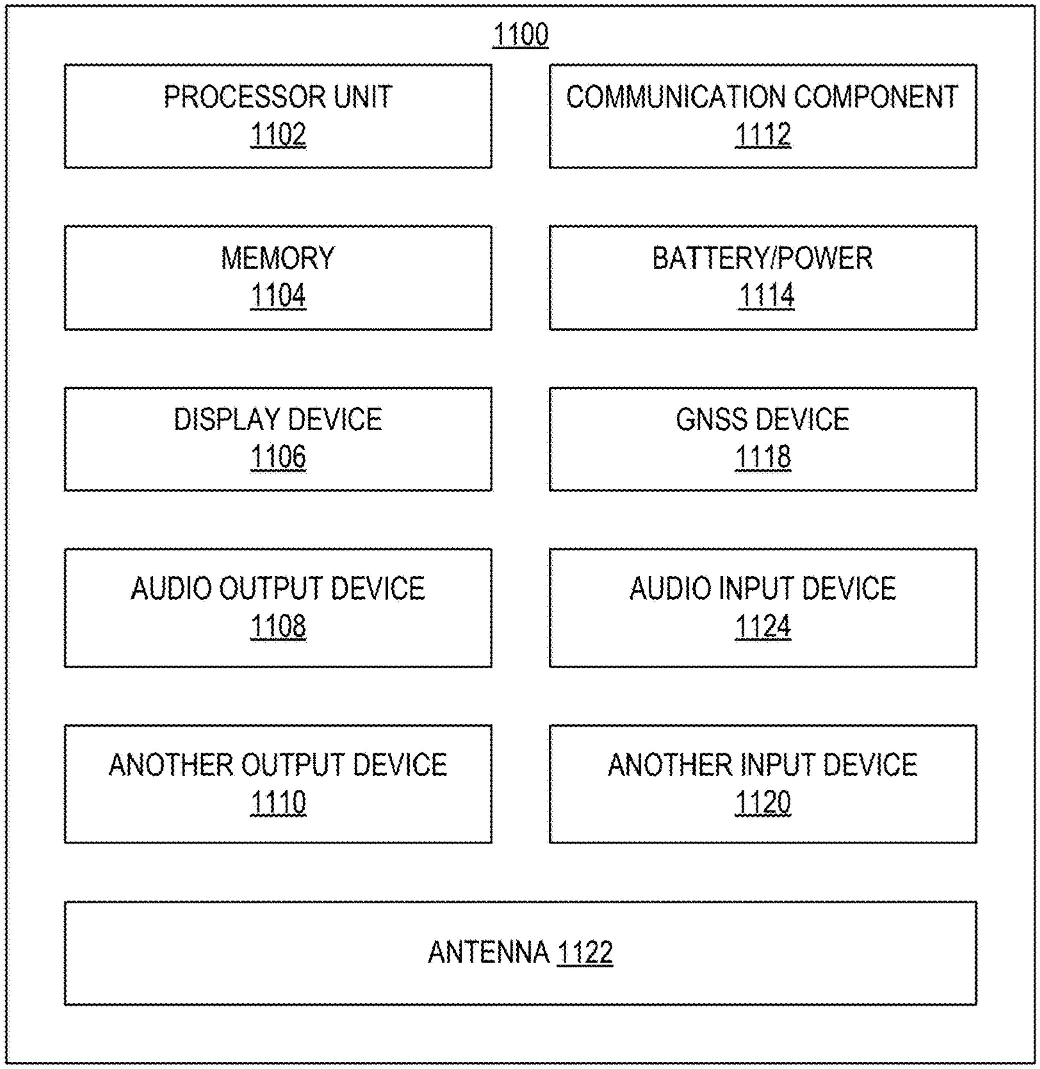
FIG. 11 is a block diagram of an example electrical device that may include a microelectronic assembly, in accordance with any of the embodiments disclosed herein.

FIG. 11 is a block diagram of an example electrical device 1100 that may include one or more of the microelectronic assemblies disclosed herein. For example, any suitable ones of the components of the electrical device 1100 may include one or more of the integrated circuit device assemblies 1000, integrated circuit components 1020, integrated circuit devices 900, or integrated circuit dies 802 disclosed herein, and may be arranged in any of the microelectronic assemblies disclosed herein. A number of components are illustrated in FIG. 11 as included in the electrical device 1100, but any one or more of these components may be omitted or duplicated, as suitable for the application. In some embodiments, some or all of the components included in the electrical device 1100 may be attached to one or more motherboards, mainboards, or system boards. In some embodiments, one or more of these components are fabricated onto a single system-on-a-chip (SoC) die.

Additionally, in various embodiments, the electrical device 1100 may not include one or more of the components illustrated in FIG. 11, but the electrical device 1100 may include interface circuitry for coupling to the one or more components. For example, the electrical device 1100 may not include a display device 1106, but may include display device interface circuitry (e.g., a connector and driver circuitry) to which a display device 1106 may be coupled. In another set of examples, the electrical device 1100 may not include an audio input device 1124 or an audio output device 1108, but may include audio input or output device interface circuitry (e.g., connectors and supporting circuitry) to which an audio input device 1124 or audio output device 1108 may be coupled.

The electrical device 1100 may include one or more processor units 1102 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1102 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1100 may include a memory 1104, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-volatile memories), solid state memory, and/or a hard drive. In some embodiments, the memory 1104 may include memory that is located on the same integrated circuit die as the processor unit 1102. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1100 can comprise one or more processor units 1102 that are heterogeneous or asymmetric to another processor unit 1102 in the electrical device 1100. There can be a variety of differences between the processing units 1102 in a system in terms of a spectrum of metrics of merit including architectural, microarchitectural, thermal, power consumption characteristics, and the like. These differences can effectively manifest themselves as asymmetry and heterogeneity among the processor units 1102 in the electrical device 1100.

In some embodiments, the electrical device 1100 may include a communication component 1112 (e.g., one or more communication components). For example, the communication component 1112 can manage wireless communications for the transfer of data to and from the electrical device 1100. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1112 may operate in accordance with other wireless protocols in other embodiments. The electrical device 1100 may include an antenna 1122 to facilitate wireless communications and/or to receive other wireless communications (such as AM or FM radio transmissions).

In some embodiments, the communication component 1112 may manage wired communications, such as electrical, optical, or any other suitable communication protocols (e.g., IEEE 802.3 Ethernet standards). As noted above, the communication component 1112 may include multiple communication components. For instance, a first communication component 1112 may be dedicated to shorter-range wireless communications such as Wi-Fi or Bluetooth, and a second communication component 1112 may be dedicated to longer-range wireless communications such as global positioning system (GPS), EDGE, GPRS, CDMA, WiMAX, LTE, EV-DO, or others. In some embodiments, a first communication component 1112 may be dedicated to wireless communications, and a second communication component 1112 may be dedicated to wired communications.

The electrical device 1100 may include battery/power circuitry 1114. The battery/power circuitry 1114 may include one or more energy storage devices (e.g., batteries or capacitors) and/or circuitry for coupling components of the electrical device 1100 to an energy source separate from the electrical device 1100 (e.g., AC line power).

The electrical device 1100 may include a display device 1106 (or corresponding interface circuitry, as discussed above). The display device 1106 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1100 may include an audio output device 1108 (or corresponding interface circuitry, as discussed above). The audio output device 1108 may include any embedded or wired or wirelessly connected external device that generates an audible indicator, such as speakers, headsets, or earbuds.

The electrical device 1100 may include an audio input device 1124 (or corresponding interface circuitry, as discussed above). The audio input device 1124 may include any embedded or wired or wirelessly connected device that generates a signal representative of a sound, such as microphones, microphone arrays, or digital instruments (e.g., instruments having a musical instrument digital interface (MIDI) output). The electrical device 1100 may include a Global Navigation Satellite System (GNSS) device 1118 (or corresponding interface circuitry, as discussed above), such as a Global Positioning System (GPS) device. The GNSS device 1118 may be in communication with a satellite-based system and may determine a geolocation of the electrical device 1100 based on information received from one or more GNSS satellites, as known in the art.

The electrical device 1100 may include another output device 1110 (or corresponding interface circuitry, as discussed above). Examples of the other output device 1110 may include an audio codec, a video codec, a printer, a wired or wireless transmitter for providing information to other devices, or an additional storage device.

The electrical device 1100 may include another input device 1120 (or corresponding interface circuitry, as discussed above). Examples of the other input device 1120 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1100 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1100 may be any other electronic device that processes data. In some embodiments, the electrical device 1100 may comprise multiple discrete physical components. Given the range of devices that the electrical device 1100 can be manifested as in various embodiments, in some embodiments, the electrical device 1100 can be referred to as a computing device or a computing system.

As used in this application and the claims, a list of items joined by the term "and/or" can mean any combination of the listed items. For example, the phrase "A, B and/or C" can mean A; B; C; A and B; A and C; B and C; or A, B and C. As used in this application and the claims, a list of items joined by the term "at least one of" can mean any combination of the listed terms. For example, the phrase "at least one of A, B or C" can mean A; B; C; A and B; A and C; B and C; or A, B, and C. Moreover, as used in this application and the claims, a list of items joined by the term "one or more of" can mean any combination of the listed terms. For example, the phrase "one or more of A, B and C" can mean A; B; C; A and B; A and C; B and C; or A, B, and C.

As used in this application and the claims, the phrase "individual of" or "respective of" followed by a list of items recited or stated as having a trait, feature, etc. means that all of the items in the list possess the stated or recited trait, feature, etc. For example, the phrase "individual of A, B, or C, comprise a sidewall" or "respective of A, B, or C, comprise a sidewall" means that A comprises a sidewall, B comprises a sidewall, and C comprises a sidewall.

The disclosed methods, apparatuses, and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

The following examples pertain to additional embodiments of technologies disclosed herein.

Example 1 is an apparatus, comprising: a substrate; a p-type semiconductor region comprising a semiconductor and a first p-type dopant; a first layer comprising a second p-type dopant and an element, a first portion of the first layer positioned adjacent to the p-type semiconductor region and a second portion of the first layer not positioned adjacent to the p-type semiconductor region, the first p-type dopant being the same or different than the second p-type dopant; a second layer positioned adjacent to the first layer, the second layer comprising a first metal; and a third layer located on the second layer, the third layer comprising a second metal.

Example 2 comprises the apparatus of example 1, wherein the p-type semiconductor region is part of the substrate and comprises a portion of a surface of the substrate.

Example 3 comprises the apparatus of example 1, wherein the p-type semiconductor region is positioned adjacent to the substrate.

Example 4 comprises the apparatus of example 1, further comprising a fin extending upwards from the substrate, the p-type semiconductor region comprising at least a portion of the fin.

Example 5 comprises the apparatus of example 1, further comprising a fin extending upwards from the substrate, the p-type semiconductor region encompassing an end of the fin.

Example 6 comprises the apparatus of any one of examples 1-5, wherein the second p-type dopant is boron.

Example 7 comprises the apparatus of example 6, wherein the element is cobalt.

Example 8 comprises the apparatus of example 6, wherein the element is lanthanum.

Example 9 comprises the apparatus of example 6, wherein the element is nickel.

Example 10 comprises the apparatus of example 6, wherein the element is niobium.

Example 11 comprises the apparatus of example 6, wherein the element is tantalum.

Example 12 comprises the apparatus of example 6, wherein the element is tungsten.

Example 13 comprises the apparatus of example 6, wherein the element is zirconium.

Example 14 comprises the apparatus of example 6, wherein the element is titanium.

Example 15 comprises the apparatus of any one of examples 1-5, wherein the second p-type dopant is indium.

Example 16 comprises the apparatus of example 15, wherein the element is antimony.

Example 17 comprises the apparatus of example 15, wherein the first metal is gallium, the first layer further comprising nitrogen.

Example 18 comprises the apparatus of any one of examples 1-5, wherein the second p-type dopant is gallium.

Example 19 comprises the apparatus of example 18, wherein the element is nitrogen.

Example 20 comprises the apparatus of example 18, wherein the element is antimony.

Example 21 comprises the apparatus of example 18, wherein the element is indium, the first layer further comprising nitrogen.

Example 22 comprises the apparatus of any one of examples 1-21, wherein the first metal is titanium.

Example 23 comprises the apparatus of any one of examples 1-21, wherein the first metal is tantalum, hafnium, zirconium, or niobium.

Example 24 comprises the apparatus of any one of examples 1-23, wherein the second metal comprises tungsten.

Example 25 comprises the apparatus of any one of examples 1-23, wherein the second metal comprises cobalt, titanium, gold, aluminum, molybdenum, chromium, or nickel.

Example 26 comprises the apparatus of any one of examples 1-25, wherein the element is a metal, at least two of the element, the first metal, and the second metal are the same.

Example 27 comprises the apparatus of any one of examples 1-25, wherein the element is a metal, at least two of the element, the first metal, and the second metal are different.

Example 28 comprises the apparatus of any one of examples 1-27, wherein a peak concentration of the second p-type dopant in the first layer exceeds $1.0\times10^{22}$ $cm^{-3}$.

Example 29 comprises the apparatus of any one of examples 1-27, wherein a peak concentration of the second p-type dopant in the first portion of the first layer exceeds $1.0\times10^{22}$ $cm^{-3}$ and a peak concentration of the second p-type dopant in the second portion of the first layer exceeds $1.0\times10^{22}$ $cm^{-3}$.

Example 30 comprises the apparatus of any one of examples 1-29, wherein a peak concentration of the second p-type dopant in the p-type semiconductor region is greater than $1.0\times10^{22}$ $cm^{-3}$.

Example 31 comprises the apparatus of any one of examples 1-30, wherein an atomic ratio of the second p-type dopant in the first layer is in the range of 5-80%.

Example 32 comprises the apparatus of any one of examples 1-30, wherein an atomic ratio of the second p-type dopant in the first layer is about 50%.

Example 33 comprises the apparatus of any one of examples 1-32, wherein the semiconductor comprises silicon.

Example 34 comprises the apparatus of any one of examples 1-32, wherein the semiconductor comprises silicon and germanium.

Example 35 comprises the apparatus of any one of examples 1-34, wherein a thickness of the first portion of the first layer is in a range of 0.5-2.0 nm.

Example 36 comprises the apparatus of any one of examples 1-35, wherein the second portion of the first layer comprises a sidewall substantially perpendicular to a surface of the substrate.

Example 37 comprises the apparatus of any one of examples 1-36, wherein a portion of the p-type semiconductor region positioned adjacent to the first portion of the first layer comprises the first metal.

Example 38 comprises the apparatus of example 37, wherein a thickness of the portion of the p-type semiconductor region positioned adjacent to the first portion of the first layer comprising the first metal is about 3 nm or less.

Example 39 comprises the apparatus of example 37, wherein a thickness of the portion of the p-type semiconductor region positioned adjacent to the first portion of the first layer comprising the first metal is about 1 nm or less.

Example 40 comprises the apparatus of any one of examples 1-36, wherein there is no first metal in the portion of the substrate positioned adjacent to the first portion of the first layer.

Example 41 comprises the apparatus of any one of examples 1-40, wherein a fourth layer is positioned between the second layer and third layer, the fourth layer comprising: cobalt; ruthenium; tantalum; tantalum and nitrogen; indium and oxygen; tungsten and nitrogen; or titanium and nitrogen.

Example 42 comprises the apparatus of any one of examples 1-41, wherein at least a portion of the second portion of the first layer is positioned adjacent to a dielectric layer comprising silicon and oxygen.

Example 43 comprises the apparatus of example 42, wherein the dielectric layer further comprises carbon, fluorine, or hydrogen.

Example 44 comprises the apparatus of any one of examples 1-43, wherein at least a portion of the second portion of the first layer is positioned adjacent to a dielectric layer comprising silicon and nitrogen.

Example 45 comprises an apparatus, comprising: a substrate comprising silicon; one or more first layers located above and separate from the substrate, the one or more first layers comprising silicon and a first p-type dopant; a second layer positioned adjacent to and encompassing the one or more first layers along at least a portion of a length of individual of the one or more first layers, the second layer comprising a semiconductor and the first p-type dopant; a third layer positioned adjacent to at least a portion of an outer surface of the second layer along at least a portion of a length of the second layer, the third layer comprising a second p-type dopant and an element, the length of individual of the first layers extending in a direction parallel to a surface of the substrate, the length of the second layer extending in the direction, the first p-type dopant being the same or different than the second p-type dopant; a fourth layer positioned adjacent to the third layer, the fourth layer comprising a first metal; and a fifth layer located on the fourth layer, the fifth layer comprising a second metal.

Example 46 comprises the apparatus of example 45, wherein the third layer encompasses a cross-sectional area of the second layer taken along a plane substantially perpendicular to the surface of the substrate.

Example 47 comprises the apparatus of example 45, wherein a first portion of the third layer is positioned adjacent to at least the portion of the outer surface of the second layer along at least the portion of the length of the second layer, the third layer further comprising one or more second portions not positioned adjacent to the second layer.

Example 48 comprises the apparatus of example 47, wherein the first portion of the third layer is physically separate from the one or more second portions of the third layer.

Example 49 comprises the apparatus of example 47, where the third layer further comprises a bottom portion substantially perpendicular to the one or more second portions of the third layer.

Example 50 comprises the apparatus of any one of examples 45-49, further comprising: one or more sixth layers comprising a third metal, the one or more sixth layers stacked vertically with respect to the surface of the substrate, individual of the sixth layers positioned between adjacent first layers along a portion of the length of the first layers not encompassed by the second layer; and one or more dielectric layers, individual of the dielectric layers comprising oxygen, individual of the dielectric layers positioned between one of the first layers and one of the sixth layers.

Example 51 comprises the apparatus of example 50, wherein individual of the dielectric layers further comprise: silicon; hafnium; hafnium and silicon; lanthanum; lanthanum and aluminum; zirconium; zirconium and silicon; tantalum; titanium; barium, strontium, titanium; barium and titanium; strontium and titanium; yttrium; aluminum; or lead, scandium, and tantalum.

Example 52 comprises the apparatus of any one of examples 45-51, the one or more first layers stacked vertically with respect to a surface of the substrate.

Example 53 comprises the apparatus of any one of examples 45-52, wherein the second p-type dopant is boron.

Example 54 comprises the apparatus of example 53, wherein the element is cobalt.

Example 55 comprises the apparatus of example 53, wherein the element is lanthanum.

Example 56 comprises the apparatus of example 53, wherein the element is nickel.

Example 57 comprises the apparatus of example 53, wherein the element is niobium.

Example 58 comprises the apparatus of example 53, wherein the element is tantalum.

Example 59 comprises the apparatus of example 53, wherein the element is tungsten.

Example 60 comprises the apparatus of example 53, wherein the element is zirconium.

Example 61 comprises the apparatus of example 53, wherein the element is titanium.

Example 62 comprises the apparatus of any one of examples 45-52, wherein the second p-type dopant is indium.

Example 63 comprises the apparatus of example 62, wherein the element is antimony.

Example 64 comprises the apparatus of example 62, wherein the element is gallium, the one or more first layers further comprising nitrogen.

Example 65 comprises the apparatus of any one of examples 45-52, wherein the second p-type dopant is gallium.

Example 66 comprises the apparatus of example 65, wherein the element is nitrogen.

Example 67 comprises the apparatus of example 65, wherein the element is antimony.

Example 68 comprises the apparatus of example 65, wherein the element is indium, the one or more first layers further comprising nitrogen.

Example 69 comprises the apparatus of any one of examples 45-67, wherein the first metal is titanium.

Example 70 comprises the apparatus of any one of examples 45-67, wherein the first metal is tantalum, hafnium, zirconium, or niobium.

Example 71 comprises the apparatus of any one of examples 45-70, wherein the second metal comprises tungsten.

Example 72 comprises the apparatus of any one of examples 45-70, wherein the second metal comprises cobalt, titanium, gold, aluminum, molybdenum, chromium, or nickel.

Example 73 comprises the apparatus of any one of examples 45-72, wherein the element is a metal, at least two of the element, the first metal, and the second metal are the same.

Example 74 comprises the apparatus of any one of examples 45-72, wherein the element is a metal, at least two of the element, the first metal, and the second metal are different.

Example 75 comprises the apparatus of any one of examples 45-74, wherein a peak concentration of the second p-type dopant in the third layer exceeds $1.0\times10^{22}$ $cm^{-3}$.

Example 76 comprises the apparatus of any one of examples 45-74, wherein a peak concentration of the second p-type dopant in the second layer is greater than $1.0\times10^{22}$ $cm^{-3}$.

Example 77 comprises the apparatus of any one of examples 45-76, wherein an atomic ratio of the second p-type dopant in the third layer is in the range of 5-80%.

Example 78 comprises the apparatus of any one of examples 45-76, wherein an atomic ratio of the second p-type dopant in the third layer is about 50%.

Example 79 comprises the apparatus of any one of examples 45-78, wherein the semiconductor comprises silicon.

Example 80 comprises the apparatus of any one of examples 45-78, wherein the semiconductor comprises silicon and germanium.

Example 81 comprises the apparatus of any one of examples 45-80, wherein a thickness of the third layer is in a range of 0.5-2.0 nm.

Example 82 comprises the apparatus of any one of examples 45-81, wherein the third layer comprises one or more sidewall portions.

Example 83 comprises the apparatus of any one of examples 45-82, wherein a fourth layer is positioned between the second layer and third layer, the fourth layer comprising: cobalt; ruthenium; tantalum; tantalum and nitrogen; indium and oxygen; tungsten and nitrogen; or titanium and nitrogen.

Example 84 comprises the apparatus of any one of examples 45-83, wherein at least a portion of the second layer is positioned adjacent to a dielectric layer comprising silicon and oxygen.

Example 85 comprises the apparatus of example 84, wherein the dielectric layer further comprises carbon, fluorine, or hydrogen.

Example 86 comprises the apparatus of any one of examples 45-83, wherein at least a portion of the second layer is positioned adjacent to a dielectric layer comprising silicon and nitrogen.

Example 87 comprises the apparatus of any one of examples 1-86, wherein the p-type semiconductor region is at least part of a source region or a drain region of a field-effect transistor.

Example 88 comprises the apparatus of any one of examples 1-87, wherein the apparatus is a processor unit.

Example 89 comprises the apparatus of any one of examples 1-88, wherein the apparatus is an integrated circuit component.

Example 90 comprises the apparatus of any one of examples 1-87, wherein the apparatus further comprises: a printed circuit board; and an integrated circuit component attached to the printed circuit board, the integrated circuit component comprising the substrate, the first layer, the second layer, and the third layer:

Example 91 comprises the apparatus of example 90, wherein the integrated circuit component is a first integrated circuit component, the apparatus further comprising one or more second integrated circuit components attached to the printed circuit board.

Example 92 comprises the apparatus of example 91, wherein the apparatus further comprises a housing enclosing the printed circuit board and the first integrated circuit component.

Example 93 comprises a method, comprising: forming a hole in a dielectric layer located on a substrate to expose a p-type semiconductor region comprising a semiconductor and a first p-type dopant; forming a first layer comprising a second p-type dopant and an element, a first portion of the first layer positioned adjacent to the p-type semiconductor region, a second portion of the first layer positioned adjacent to one or more sidewalls of the hole, the first p-type dopant being the same or different than the second p-type dopant; forming a second layer comprising a first metal, the second layer positioned adjacent to the first layer; and forming a third layer comprising a second metal, the third layer located on the second layer and at least partially filling the hole.

Example 94 comprises the method of example 93, wherein the p-type semiconductor region is part of the substrate and comprises a portion of a surface of the substrate.

Example 95 comprises the method of example 94, wherein the p-type semiconductor region is positioned adjacent to the substrate.

Example 96 comprises the method of example 94, wherein the p-type semiconductor region comprises at least a portion of a fin extending upwards from a surface of the substrate.

Example 97 comprises the method of example 94, wherein the p-type semiconductor region encompasses an end of a fin extending upwards from a surface of the substrate.

Example 98 comprises the method of any one of examples 93-97, wherein the second p-type dopant is boron.

Example 99 comprises the method of example 98, wherein the element is titanium.

Example 100 comprises the method of example 98, wherein the element is tantalum.

Example 101 comprises the method of example 98, wherein the element is cobalt, lanthanum, nickel, niobium, tungsten, or zirconium.

Example 102 comprises the method of any one of examples 93-97, wherein the second p-type dopant is indium.

Example 103 comprises the method of example 102, wherein the element is antimony.

Example 104 comprises the method of example 102, wherein the element is nitrogen, the first layer further comprising indium.

Example 105 comprises the method of example 102, wherein the second p-type dopant is gallium.

Example 106 comprises the method of example 105, wherein the element is nitrogen.

Example 107 comprises the method of example 105, wherein the element is antimony.

Example 108 comprises the method of example 105, wherein the element is indium, the first layer further comprising nitrogen.

Example 109 comprises the method of any one of examples 93-108, wherein the first metal is titanium, tantalum, hafnium, zirconium, or niobium.

Example 110 comprises the method of any one of examples 93-109, wherein the second metal is tungsten, cobalt, titanium, gold, aluminum, molybdenum, chromium, or nickel.

Example 111 comprises the method of any one of examples 93-110, wherein a peak concentration of the second p-type dopant in the first layer exceeds $1.0\times10^{22}$ $cm^{-3}$.

Example 112 comprises the method of any one of examples 93-110, wherein a peak concentration of the second p-type dopant in the first portion of the first layer exceeds $1.0\times10^{22}$ $cm^{-3}$ and a peak concentration of the second p-type dopant in the second portion of the first layer exceeds $1.0\times10^{22}$ $cm^{-3}$.

Example 113 comprises the method of any one of examples 93-112, wherein an atomic ratio of the second p-type dopant in the first layer is in the range of 5-80%.

Example 114 comprises the method of any one of examples 93-112, wherein an atomic ratio of the second p-type dopant in the first layer is about 50%.

Example 115 comprises the method of any one of examples 93-114, wherein the semiconductor comprises silicon.

Example 116 comprises the method of any one of examples 93-114, wherein the semiconductor comprises silicon and germanium.

Example 117 comprises the method of any one of examples 93-116, wherein a thickness of the first portion of the first layer is in a range of 0.5-2.0 nm.

Example 118 comprises the method of any one of examples 93-117, further comprising forming a fourth layer positioned between the second layer and third layer, the fourth layer comprising: cobalt; ruthenium; tantalum; tantalum and nitrogen; indium and oxygen; tungsten and nitrogen; or titanium and nitrogen.

Example 119 comprises the method of any one of examples 93-118, wherein the substrate is a wafer.

The invention claimed is:

1. An apparatus, comprising:

a substrate comprising silicon;

one or more first layers located above and separate from the substrate, the one or more first layers comprising silicon and a first p-type dopant, the one or more first layers stacked vertically with respect to a surface of the substrate;

a second layer positioned adjacent to and encompassing the one or more first layers along at least a portion of a length of individual of the one or more first layers, the second layer comprising silicon, germanium, and the first p-type dopant;

a third layer positioned adjacent to at least a portion of an outer surface of the second layer along at least a portion of a length of the second layer, the third layer comprising a second p-type dopant and an element, the length of individual of the one or more first layers extending in a direction parallel to a surface of the substrate, the length of the second layer extending in the direction, the first p-type dopant being same as or different from the second p-type dopant;

a fourth layer positioned adjacent to the third layer, the fourth layer comprising a first metal; and a fifth layer located on the fourth layer, the fifth layer comprising a second metal.

2. The apparatus of claim 1, wherein the third layer encompasses a cross-sectional area of the second layer taken along a plane substantially perpendicular to the surface of the substrate.

3. The apparatus of claim 1, wherein a first portion of the third layer is positioned adjacent to at least the portion of the outer surface of the second layer along at least the portion of the length of the second layer, the third layer further comprising one or more second portions not positioned adjacent to the second layer.

4. The apparatus of claim 1, wherein the second p-type dopant is boron and the element is cobalt, lanthanum, nickel, niobium, tantalum, tungsten, zirconium, or titanium.

5. The apparatus of claim 1, wherein the second p-type dopant is indium and the element is antimony.

6. The apparatus of claim 1, wherein the second p-type dopant is indium, the element is gallium, and the third layer further comprises nitrogen.

7. The apparatus of claim 1, wherein the second p-type dopant is gallium and the element is nitrogen or antimony.

8. The apparatus of claim 1, wherein the second p-type dopant is gallium, the element is indium, and the third layer further comprises nitrogen.

9. The apparatus of claim 1, wherein the first metal is titanium, tantalum, hafnium, zirconium, or niobium.

10. The apparatus of claim 1, wherein a peak concentration of the second p-type dopant in the third layer exceeds $1.0\times10^{22}$ $cm^{-3}$.

11. The apparatus of claim 1, wherein the apparatus is an integrated circuit component.

12. The apparatus of claim 1, wherein the apparatus further comprises:

a printed circuit board; and a first integrated circuit component attached to the printed circuit board, the first integrated circuit component comprising the substrate, the one or more first layers, the second layer, and the third layer, the apparatus further comprising one or more second integrated circuit components attached to the printed circuit board.

* * * * *